United States Patent [19]

Hori et al.

[11] Patent Number: 4,686,650
[45] Date of Patent: Aug. 11, 1987

[54] MONOLITHIC STORAGE DEVICE

[75] Inventors: Ryoichi Hori, Tokyo; Kiyoo Ito, Higashikurume, both of Japan

[73] Assignee: Hitachi, Ltd., Tokyo, Japan

[21] Appl. No.: 857,302

[22] Filed: Apr. 30, 1986

Related U.S. Application Data

[63] Continuation of Ser. No. 564,497, Dec. 22, 1983, Pat. No. 4,611,299, which is a continuation of Ser. No. 351,225, Feb. 22, 1982, abandoned.

[30] Foreign Application Priority Data

Feb. 27, 1981 [JP] Japan ................... 56-28109

[51] Int. Cl.$^4$ ............................................ G11C 13/00
[52] U.S. Cl. .................... 365/189; 365/190; 365/230; 365/219
[58] Field of Search .............. 365/189, 190, 230, 220, 365/221

[56] References Cited

U.S. PATENT DOCUMENTS

| | | | |
|---|---|---|---|
| 3,402,398 | 9/1968 | Koevner | 365/189 |
| 3,753,242 | 8/1973 | Townsend | 365/94 |
| 3,763,480 | 10/1973 | Weimer | 365/238 |
| 3,772,658 | 11/1973 | Sarlo | 365/238 |
| 4,044,341 | 8/1977 | Stewart et al. | 365/189 |
| 4,106,109 | 8/1978 | Fassbender | 365/221 |
| 4,114,192 | 9/1978 | Suzuki et al. | 365/190 |
| 4,150,364 | 4/1979 | Baltzer | 365/220 |
| 4,288,864 | 9/1981 | Harroun et al. | 365/219 |
| 4,330,852 | 5/1982 | Redwine et al. | 365/221 |
| 4,611,299 | 9/1986 | Hori et al. | 365/189 |

Primary Examiner—Terrell W. Fears
Attorney, Agent, or Firm—Antonelli, Terry & Wands

[57] ABSTRACT

In a monolithic storage device having bit lines to which a plurality of memory cells are connected, and I/O lines which connect an external data input/output terminal and the bit lines and which exchange data between the input/output terminal and the bit lines; the improvement wherein said bit lines are divided into a plurality of groups each having the I/O lines, and a deserializer circuit is disposed between said each I/O line and an input terminal.

21 Claims, 30 Drawing Figures

MONOLITHIC STORAGE DEVICE

This is a continuation of application Ser. No. 564,497, filed Dec. 22, 1983, now U.S. Pat. No. 4,611,299, which is a continuation of application Ser. No. 351,225, filed Feb. 22, 1982, now abandoned.

BACKGROUND OF THE INVENTION

The present invention relates to a monolithic memory such as MOS dynamic memory.

FIG. 1 shows the schematic circuit arrangement of a prior-art dynamic memory employing N-type MOS transistors, which adopts the so-called address multiplex system of dividing address signals into the two groups of row addresses and column addresses and applying them through the same input terminal in a time-division fashion. The arrangement of FIG. 1 has the function, called "page mode", of successively changing only the column addresses with the row address fixed. In FIG. 1 and other drawings, reference symbols with suffixes R and C are assigned to circuit parts pertaining to a row selecting operation and a column selecting operation, respectively. Symbols 1R and 1C denote external control clocks. Principally, the former controls the start of the row selecting operation, and the latter the start of the column selecting operation. Circuits 2R and 2C receive the inputs 1R an 1C and generate a plurality of timing pulses necessary for operations within the memory, respectively. In the figure, among the timing pulses, only typical outputs 11R, 12R, 13R and 12C are mentioned with the others omitted. The circuit 2C responds to the signal 1C only under the condition that the signal 11R is applied thereto. An address input terminal 3 includes a plurality of signal lines for applying a plurality of bits of the row or column address in parallel. Address buffer circuits 4R and 4C receive the row address and column address applied through the terminal 3 in time division and deliver an internal row address signal 14R as well as its inverted signal $\overline{14R}$ and an internal column address signal 14C as well as its inverted signal $\overline{14C}$ in accordance with address buffer control signals 12R and 12C supplied from the circuits 2R and 2C, respectively. The signals 14R and $\overline{14R}$ are supplied to a word line selector 5R which consists of a row decoder (not shown), drivers (not shown) for word lines $W_1$-$W_m$, etc., while the signals 14C and $\overline{14C}$ are supplied to a bit line selector 5C which consists of a column decoder (not shown), drivers (not shown) for bit line select lines $Y_1$-$Y_n$, etc. Numeral 100 designates a memory cell array portion, which has pairs of bit lines $B_1$-$B_n$ as the so-called folded bit lines. A memory cell MC constructed of one MOS transistor is arranged at one of the two intersecting points between each bit line pair $B_1$-$B_n$ and each word line $W_1$-$W_m$. Dummy cells (not shown) are also connected to the respective bit lines. A circuit 6R for sensing a minute signal from the memory cell MC is constructed of transistors $Q_1$ and $Q_2$, and is operated under the instruction of the sensor drive signal 13R supplied from the circuit 2R. A gate circuit 101 includes a pair of MOS transistors disposed every data line pair, and operates to connect an input/output data line pair I/O and the corresponding bit line pair in response to the signal of the line $Y_1$-$Y_m$. Symbol 6C indicates a detector circuit, symbol 7C an output amplifier circuit, and numeral 8 an output terminal. Numeral 9 indicates a data input terminal, and symbol 10C a data input buffer. The various circuits in FIG. 1 are of the dynamic type. Hereunder, the operation of the circuit arrangement in FIG. 1 will be described with reference to FIG. 2.

When the row selection control clock 1R becomes its low level, the clock 12R among the plurality of internal clocks required for the internal operations is generated by the circuit 2R, while a row address R applied through the lines 3 in synchronism with the fall of the signal 1R is received by the circuit 4R. Thus, the internal address signals 14R and $\overline{14R}$ are generated. Since this memory operates in accordance with the address multiplex system, only the row address R is first applied to the lines 3. $C_1$, $C_2$, $C_3$ ... $C_j$ in FIG. 2 represent column addresses which are applied later.

In response to the internal address signals 14R and $\overline{14R}$, the circuit 5R operates to select one of the word lines $W_1$-$W_m$, for example, $W_1$. Thus, the plurality of memory cells connected to the selected word line $W_1$ are read out. The respective bit lines are provided with the dummy cells (not shown), and the dummy cells which are connected to the bit lines pairing with the bit lines having the selected memory cells connected thereto are read out by the circuit 5R. In this way, minute signals are read out on the n pairs of bit lines. Thereafter, the signal 13R becomes its low potential, and the sensing circuits 6R are operated to differentially amplify the voltages of the corresponding data line pairs. With these operations, the row selecting operation is substantially completed.

Thereafter, when the column selection control clock 1C becomes its low level, the circuit 2C generates the signal 12C. The signal 11R is the inverted signal of the signal 1R, and the circuit 2C is so arranged as to respond to the fall of the signal 1C only when the signal 11R is at its high level. The circuit 2C responds to the rise of the signal 1C irrespective of the level of the signal 11R. In response to the signal 12C, the circuit 4C receives the column address $C_1$ applied through the lines 3 in synchronism with the fall of the signal 1C and generates the internal address signals 14C and $\overline{14C}$. The circuit 5C responds to the signals 14C and $\overline{14C}$ to select one of the bit line select lines $Y_1$-$Y_n$, for example, $Y_1$. Thus, the MOS transistors $Q_3$ and $Q_4$ of the gate circuit 101 turn "on", so that the signals of the data line pair $B_1$ are transmitted to the input/output data line pair I/O and are differentially amplified by the detector 6C. The output of the detector 6C is further amplified by the output amplifier 7C, with the result that a read-out data 1 is delivered to the output terminal 8.

In the ordinary mode, both the signals 1R and 1C are subsequently returned to their high potentials, and the memory is restored into the original stand-by status. The signals of the memory at this time assume levels indicated by dotted lines in FIG. 2.

More specifically, the circuit 2R has a circuit (not shown) which, when the signal 1R has become the high level, supplies the circuits relevant to the row selecting operation, e.g., 4R, 5R and 6R and the cell array portion 100 with signals for bringing them into stand-by states (i.e., precharged states). On the other hand, the circuit 2C has a circuit (not shown) which, when the signal 1C has become the high level, supplies the circuits relevant to the column selecting operation, e.g., 4C, 5C, 6C, 7C and 10C and the data line pair I/O with signals for precharging them into stand-by states.

On the other hand, in the page mode operation, after the output has appeared at the output terminal 8, the signal 1R is kept intact in the low potential state and only the signal 1C is turned "on" and "off" as indicated by solid lines in FIG. 2, whereby only the column selecting operations are successively carried out.

In the page mode, the signal 1R is in the low potential state. Therefore, the circuits relevant to the row selecting operation hold the previous states, in other words, the word line $W_1$ is selected in the present example. In addition, the sensors 6R are held in the operative states. Accordingly, when the signal 1C falls into the high potential state, only the circuits relevant to the column selecting operation, e.g., the circuits 2C, 4C, 5C, 6C and 7C fall into the stand-by states since predetermined timings and make ready for the subsequent operation. Thereafter, when the signal 1C becomes the low potential, the circuits 2C and 4C operate as stated before, and the circuit 4C receives the next column address C2 applied through the lines 3 and supplies the signals 14C and $\overline{14C}$ to the circuit 5C. The circuit 5C selects that one of the bit line pair select lines $Y_1$-$Y_n$ which corresponds to the signals 14C and $\overline{14C}$. The signals of the bit line pair corresponding to the bit line pair select line are transmitted to the input/output data line pair I/O, and a data is delivered to the output terminal 8 via the circuit 7C. Thenceforth, similar operations are continued, and data corresponding to the column addresses $C_3$, $C_4$ ... $C_j$ are successively delivered to the terminal 8. Upon end of the page mode, both the signals 1C and 1R are returned to the high levels, and the memory is restored into the original stand-by status.

As described above, the row selecting operation is not repeated in the page mode. Therefore, the operation of higher speed than in the ordinary mode becomes possible. An access time during the page mode operation is equal to the period of time $t_{CA}$ from the reception of the column address to the delivery of the data, and this period of time $t_{CA}$ is about ½ to ⅔ of an access time $t_{RA}$ during the ordinary mode operation (the period of time from the reception of the row address to the delivery of the data).

The largest number of data j up to which the data can be successively read out in the page mode is equal, in principle, to the number n of the bit line pairs which can be appointed by column addresses, on the assumption that the data of the memory cells of different addresses are read out at all times. In memories of the address multiplex system, the number n of bit line pairs and the number m of word lines are usually equalized. The aforementioned largest number j therefore becomes $\sqrt{N}$ where N denotes the storage capacity of the whole memory. This value is the principle value, and can be properly altered in relation to the other characteristics. Usually, the largest number j of data lies in a range of from several tens to several hundred. In the page mode, different data in this amount can be successively read out in the aforementioned access times.

In using the memory as the main storage of an electronic computer, however, even the page mode described above is low in the access rate.

SUMMARY OF THE INVENTION

An object of the present invention is to provide a memory which can operate in a mode of still shorter access time than in the prior-art page mode.

In order to accomplish the object, according to the present invention, a memory cell array is divided into a plurality of blocks, each of which is equipped with an input/output data line pair. In response to the same column address, a selector transmits outputs of the respective blocks to the corresponding input/output data line pair in such a manner that one output is delivered from each block. A serializer delivers the signals on the input/output data line pairs in series.

PREFERRED EMBODIMENTS OF THE INVENTION

Hereunder, the present invention will be described in conjunction with embodiments.

(1) Continuous Mode

Figure 1:
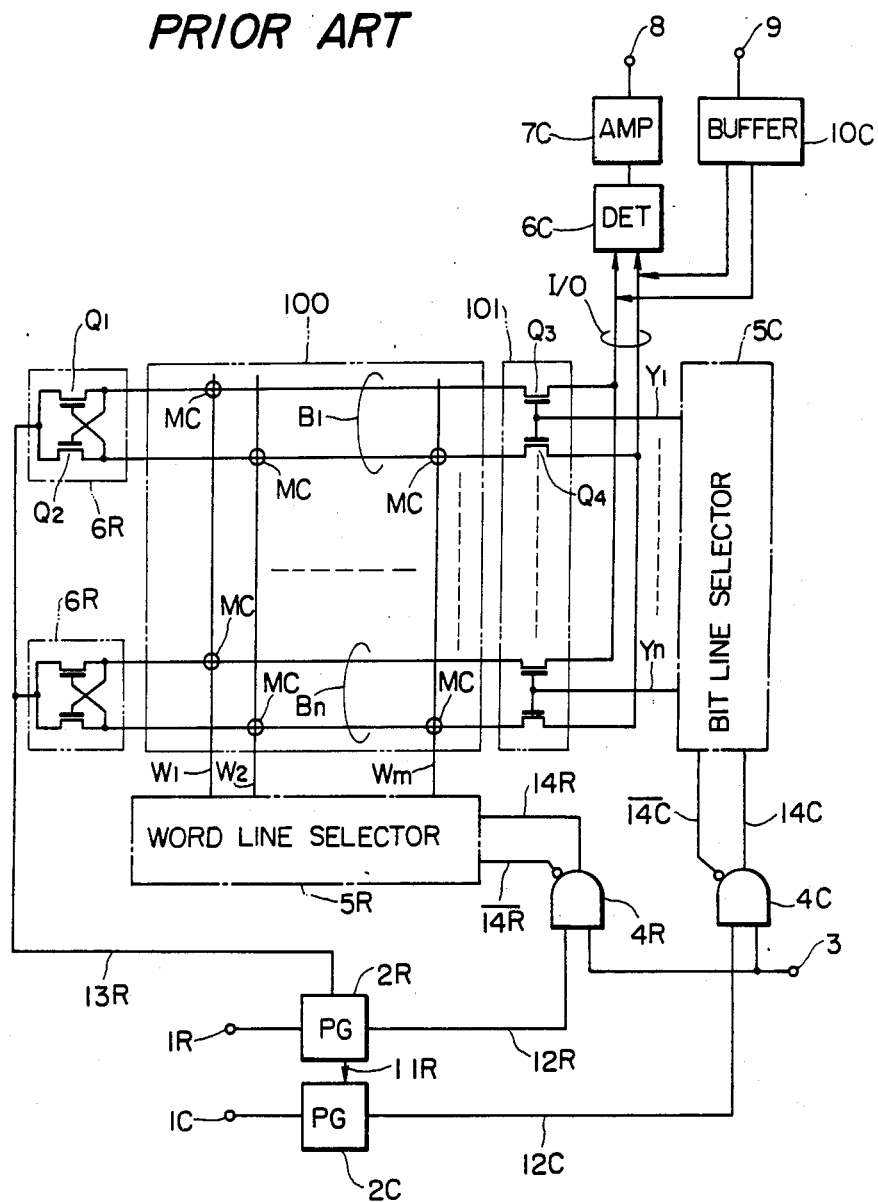
FIG. 1 is a schematic circuit diagram of a prior-art dynamic memory employing MOS transistors.
Figure 2:
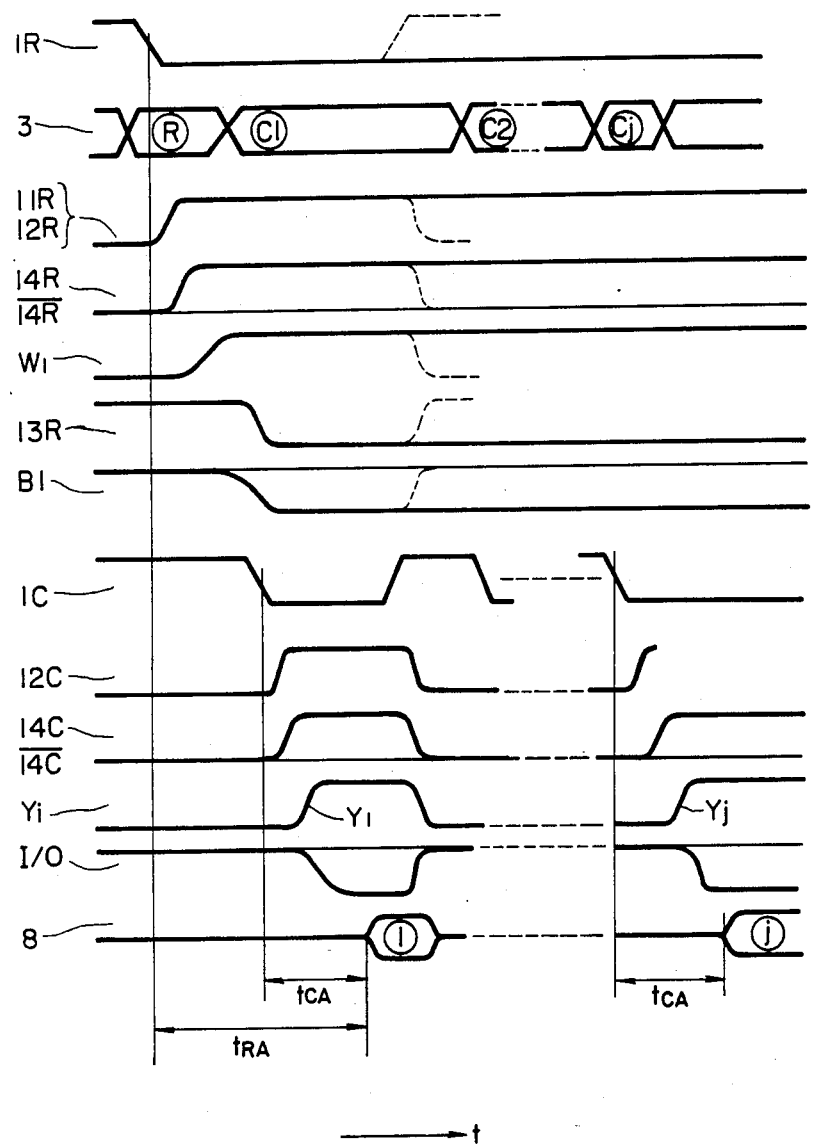
FIG. 2 is a time chart showing the operation of the memory in FIG. 1.
Figure 3:
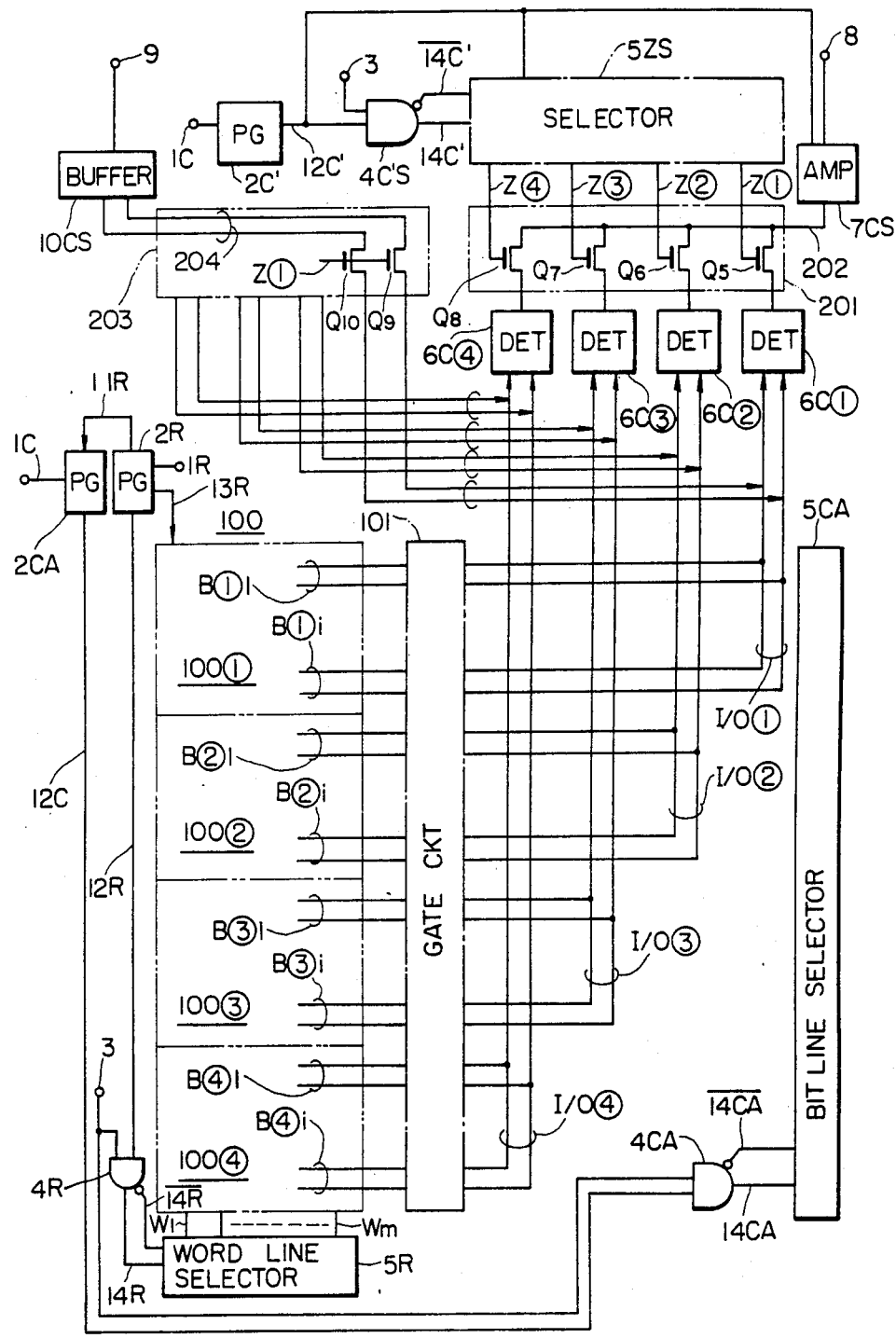
FIG. 3 shows an embodiment of the present invention in which static circuits are employed as some constituents.

In FIG. 3 illustrative of a memory according to the present invention, the same reference symbols as in FIG. 1 indicate the same parts. A memory cell array 100 is the array of memory cells having the same structure as in FIG. 1. In this embodiment, four input/output data line pairs I/O 1 -I/O 4 are disposed, so that four bit line pairs are simultaneously selected from the cell array 100 at a column selecting operation. To this end, the cell array 100 is divided into four blocks 100 1 -100 4, which have the bit line pairs in an equal number i. The bit line pairs of the block j ($1 \leq j \leq 4$) shall be expressed by symbols B j 1-B j i. The column addresses of the bit line pairs B 1 k-B 4 k ($1 \leq k \leq i$) are so determined that the bits thereof other than lower 2 bits are identical.

In this embodiment, the address multiplex system is employed as in the prior art of FIG. 1.

An address buffer circuit 4CA differs from the circuit 4C in FIG. 1 in point of receiving only the upper bits other than the lower 2 bits within a column address applied through lines 3 and then delivering an internal column address signal 14CA corresponding thereto, as well as its inverted signal $\overline{14CA}$.

A bit line selector 5CA is accordingly adapted to respond to the internal address signals 14CA and $\overline{14CA}$, and it is different from the bit line selector 5C in FIG. 1. For the sake of brevity, signal lines for connecting the bit line selector 5CA and a gate circuit 101 are not illustrated.

In corespondence with the four data line pairs I/O 1 -I/O 4, detector circuits 6C 1 -6C 4 are disposed. Furher, the memory of FIG. 3 differs from that of FIG. 1 in point of including a circuit 201 for selecting outputs of the detector circuits, a circuit 5ZS for controlling the circuit 201, a circuit 7CS for amplifying an output of the circuit 5ZS, a buffer 4C'S for supplying the circuit 5ZS with an address to-be-selected, a circuit 2C' for generating a pulse starting the buffer 4C'S, a circuit 203 for selecting data to-be-written, and a write data buffer 10CS.

Figure 4A:
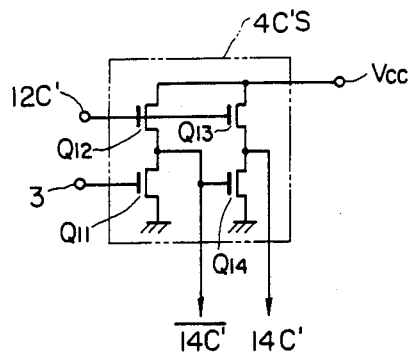
FIG. 4A is a circuit arrangement diagram of a buffer for use in the memory of FIG. 3.
Figure 4B:
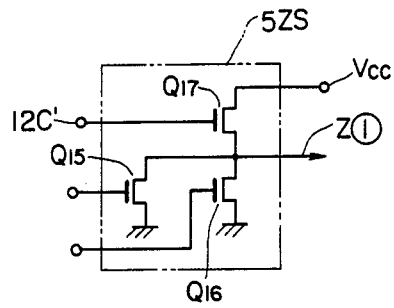
FIG. 4B is an arrangement diagram of a selector for use in the memory of FIG. 3.
Figure 4C:
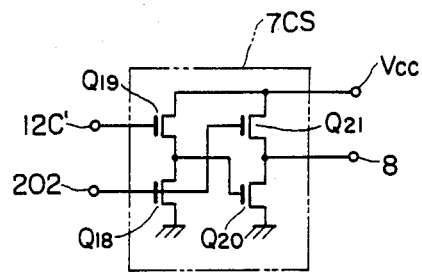
FIG. 4C is an arrangement diagram of an output amplifier for use in the memory of FIG. 3.

The buffer 4C'S, the selector 5ZS and the output amplifier 7CS are constructed of static circuits, and the respective circuit arrangements thereof are shown in FIGS. 4A-4C. Also the buffer 10CS is of the static type. The other circuits are of the dynamic type.

Since the output amplifier 7C in FIG. 1 is of the dynamic type, the circuit 2C has the circuit (not shown) which supplies the circuit 7C with the signal for precharging it into the stand-by state each time the signal 1C becomes the high level. In contrast, the output amplifier 7CS in FIG. 3 is of the static type, so that the signal need not be supplied from a circuit 2CA to the circuit 7CS. The circuit 2CA is accordingly different from the circuit 2C of FIG. 1 in including no such supply circuit.

The circuit 2C' is a circuit which delivers the inverted signal $\overline{12C'}$ of the signal 1C each time the level of the signal 1C is inverted.

In the embodiment of FIG. 3, the sensor 6R in FIG. 1 is used as it is. For the sake of brevity, it is not illustrated in FIG. 3 and is assumed to be contained in the memory cell array portion 100.

Figure 5:
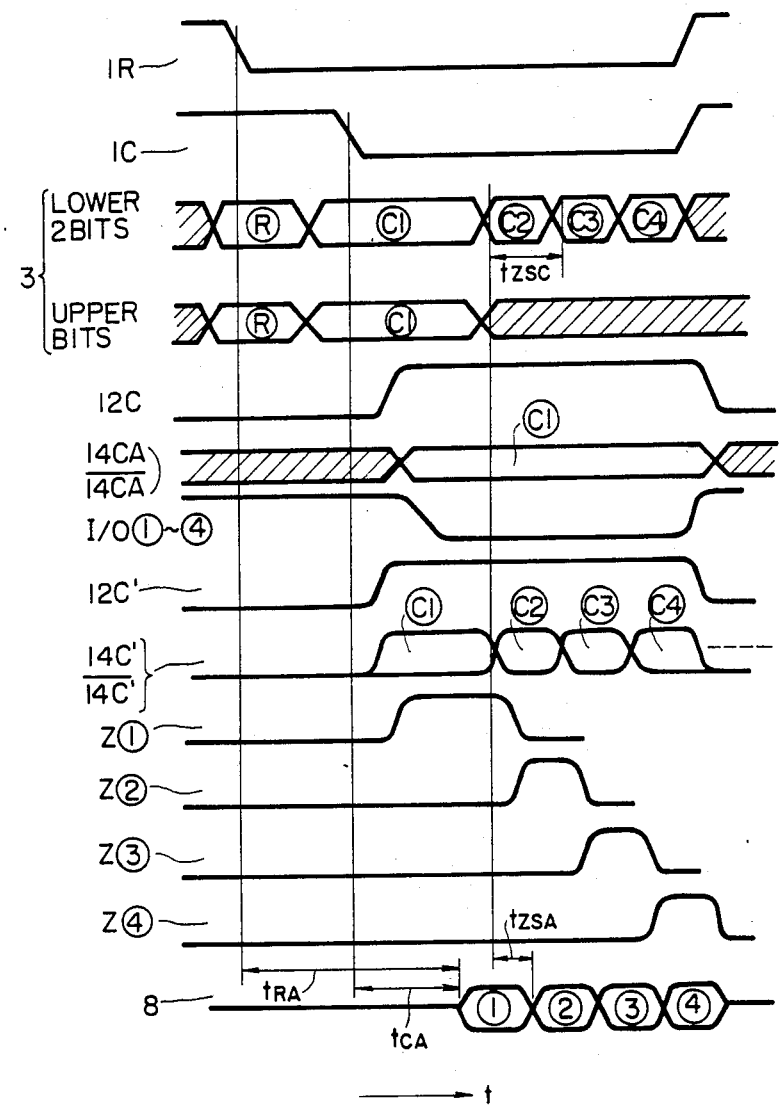
FIG. 5 is a time chart showing the operation of the memory in FIG. 3.

Referring now to FIG. 5, the operation of the embodiment will be described.

A row selecting operation is performed on the basis of a row address R in response to a signal 1R in quite the same manner as in FIG. 1. Thereafter, a column selecting operation based on a column address C1 is performed in response to the signal 1C.

The column address C1 is applied to the lines 3 and then to the buffer 4CA substantially in synchronism with the fall of the signal 1C or before the fall of the signal 1C. The buffer 4CA receives the upper side bits of the address C1 other than the lower 2 bits thereof at the rise of a signal 12C which is generated in response to the signal 1C. Thus, the buffer 4CA generates the internal address signals 14CA and $\overline{14CA}$. Thereafter, it does not change its outputs even when the address on the lines 3 has changed, until the signal 1C becomes the high level and the buffer 4CA is precharged.

In response to the internal address signals 14CA and $\overline{14CA}$, the bit line selector 5CA controls the gate circuit 101 so as to simultaneously select the bit line pairs of the respective blocks 100 1 -100 4 in a manner to select one pair from each block, for example, the bit line pairs B 1 1, B 2 1, B 3 1 and B 4 1. In consequence, signals are sent to the data line pairs I/O 1 -I/O 4. These signals are differentially amplified by the respective detectors 6C 1 -6C 4, and the amplified signals are supplied to the selector 201 composed of MOS transistors $Q_5$-$Q_8$. The circuit 2C' generates in response to the signal 1C a plurality of timing pulses for an operation according to the present invention (hereinbelow, the operation shall be called the "continuous mode operation"). In the figure, only the inverted signal 12C' of the signal 1C is shown as a typical output of the circuit 2C', and the other outputs are omitted. When the signal 12C' is at the high level, the address buffer 4C'S is a circuit which delivers an internal address signal 14C' and its inverted signal $\overline{14C'}$ in response to the lowest 2 bits of the column address C1 applied through the lines 3. As stated before, it is of the static type.

FIG. 4A shows an example of that part of the address buffer 4C'S which concerns one address bit. It is an inverter circuit of 2 stages composed of driving MOS transistors $Q_{11}$ and $Q_{14}$ and load MOS transistors $Q_{12}$ and $Q_{13}$. The signal 14C' is the non-inverted signal of one bit of the address applied to the lines 3, while the signal $\overline{14C'}$ is the inverted signal thereof. The reason why the gates of the load transistors $Q_{12}$ and $Q_{13}$ are controlled by the signal 12C' here, is that when the signal 1C is not applied, i.e., in the stand-by state, these load MOS transistors are held "off" so as to reduce the power dissipation.

That part of the buffer 4C'S which concerns the other 1 bit of the column address is constructed quite similarly to the above. The buffer 4C'S which is the static circuit starts its operation when the signal 12C' has become the high potential. Therefore, it receives the lower 2 bits of the first column address C1 in synchronism with the signal 12C'. In the state in which the signal 12C' is held at the high potential, the outputs 14C' and $\overline{14C'}$ change in accordance with the change of the address applied from the lines 3 and after a delay time inherent in the circuit (1—several nsec.).

The decoder 5ZS selects one of lines Z 1 -Z 4 in response the outputs of the buffer 4C'S. Here is exemplified a case where the line $Z_1$ is selected in accordance with the address $C_1$.

FIG. 4B shows that part of the decoder 5ZS which selects the output line $Z_1$. It is arranged as a NOR circuit for the lower 2 bits of the column address applied to the gates of transistors $Q_{15}$ and $Q_{16}$, and it delivers the high potential to the output $Z_1$ through a load transistor $Q_{17}$ under the state under which both the inputs are at the low potential. This circuit is also of the static type, so that the output changes immediately in response to the level change of the input address when the signal 12C′ is at the high level.

That part of the decoder 5ZS which selects the output line $Z_2$ is similarly constructed. The reason why the gate of the load transistor $Q_{17}$ is controlled by the signal 12C′ is the same as in the case of FIG. 4A.

When the signals of the data line pairs $I/O_1$ – $I/O_4$ have been differentially amplified by the respective detectors $6C_1$ – $6C_4$, the decoder 5ZS has already selected the line $Z_1$ corresponding to the column address $C_1$, so that the output of the circuit $6C_1$ is selected by the MOS transistor $Q_5$ and supplied to the output amplifier 7CS through a line 202.

As shown in FIG. 4C, the output amplifier 7CS is constructed of an inverter circuit composed of MOS transistors $Q_{18}$ and $Q_{19}$ and a push-pull circuit composed of MOS transistors $Q_{20}$ and $Q_{21}$. This circuit is also of the static type, and delivers the signal on the line 202 to a terminal 8 after a time delay inherent in the circuit. The signal 12C′ is applied to the load transistor $Q_{19}$ for the same reason as in FIG. 4A.

In this way, as in the prior art, the first data $1$ corresponding to the addresses $R$ and $C_1$ is delivered to the terminal 8 after lapse of the time $t_{RA}$ or $t_{CA}$ since the signal 1R or 1C has become the low level, respectively.

Thereafter, the signals 1R and 1C are maintained at the low potential, and the memory holds the original operative status. Accordingly, the four data read out from the four blocks of the memory are held on the data line pairs $I/O_1$ – $I/O_4$, and the detectors $6C_1$ – $6C_4$ keep delivering the amplified signals of the four data.

At the timing at which the operation of the output amplifier 7CS is finished to deliver the data $1$, the next column address $C_2$ is applied through the lines 3. This column address $C_2$ differs from the column address $C_1$ in only the lower 2 bits. The outputs 14C′ and $\overline{14C'}$ of the circuit 4C′S change in response to the lower 2 bits of the address $C_2$, and the output line, e.g., $Z_2$ corresponding to the lower 2 bits of the address $C_2$ is selected by the circuit 5ZS. Thus, the transistor $Q_6$ is turned "on", so that the content of the detector $6C_2$ is delivered as a data $2$ to the terminal 8 through the output amplifier 7CS. Thenceforth, each time the operation of the output amplifier 7CS is finished, the column address $C_3$ or $C_4$ is applied, and a similar operation is repeated. Thus, the corresponding data $3$ and $4$ are successively delivered.

Meantime, the signal 12C remains at the high level. Therefore, the buffer 4CA does not receive the upper side bits of the addresses $C_2$ – $C_4$, and its outputs 14CA and $\overline{14CA}$ remain those for the address $C_1$. This signifies that the upper side bits of the addresses $C_2$ – $C_4$ need not be applied from the lines 3. In FIG. 5, accordingly, the signals on the lines 3 are illustrated under the condition that the upper bits of the addresses $C_2$ – $C_4$ are not applied.

After the end of this continuous mode, the signals 1C and 1R are restored to the high levels, and the memory reverts into the stand-by status. More specifically, the static circuits 4C′S, 5ZS and 7CS fall into the stand-by states in accordance with the fact that their input signal 12C′ has become the low level, and the other circuits of the memory being of the dynamic type are precharged by a signal which is supplied from either a circuit 2R or the circuit 2CA.

In the embodiment stated above, the access time in the continuous mode, that is, the period of time $t_{ZSA}$ in which the data $2$ – $4$ is delivered after the application of the second or subsequent column address $C_2$ – $C_4$, is determined by the operating speeds of the few circuits of the circuits 4C′S, 5ZS and 7CS. Moreover, these circuits are of the static type which does not require precharging in contrast to dynamic circuits. Therefore, the aforementioned time $t_{ZSA}$ becomes as very small as $\frac{1}{2}$–1/5 of the access time $t_{CA}$ of the page mode of the prior-art memory, and the continuous operation of high speed becomes possible. In addition, the cycle time $t_{ZSC}$ of the high-speed operation is shortened to $\frac{1}{2}$–1/5 of that in the prior art substantially similarly to the access time $t_{ZSA}$.

While the reading operation has been described above, a writing operation proceeds similarly. As illustrated in FIG. 3, a pair of differential write data are continuously supplied from a data input terminal 9 to the data line pairs $I/O_1$ – $I/O_4$ via the data input buffer 10CS, lines 204, and the selector 203 which as an arrangement similar to that of the selector for read-out 201 and which is controlled by the circuit 5ZS. Thus, continuous writing at high speed is carried out.

(2) Combined Mode of Continuous Mode and Page Mode

In the above embodiment, in case of reading/writing at least five different data, after the four data have been handled by the continuous mode, it is required that as illustrated in FIG. 5, the signals 1R and 1C are returned to the high potential so as to restore all the circuits into the stand-by states, whereupon the continuous mode operation is started again. Accordingly, the continuous mode is executed only intermittently, and there is left room for further improving a speed in case of reading out large quantities of data. Hereunder, there will be described several embodiments capable of the continuous mode operation for large quantities of data.

Figure 6:
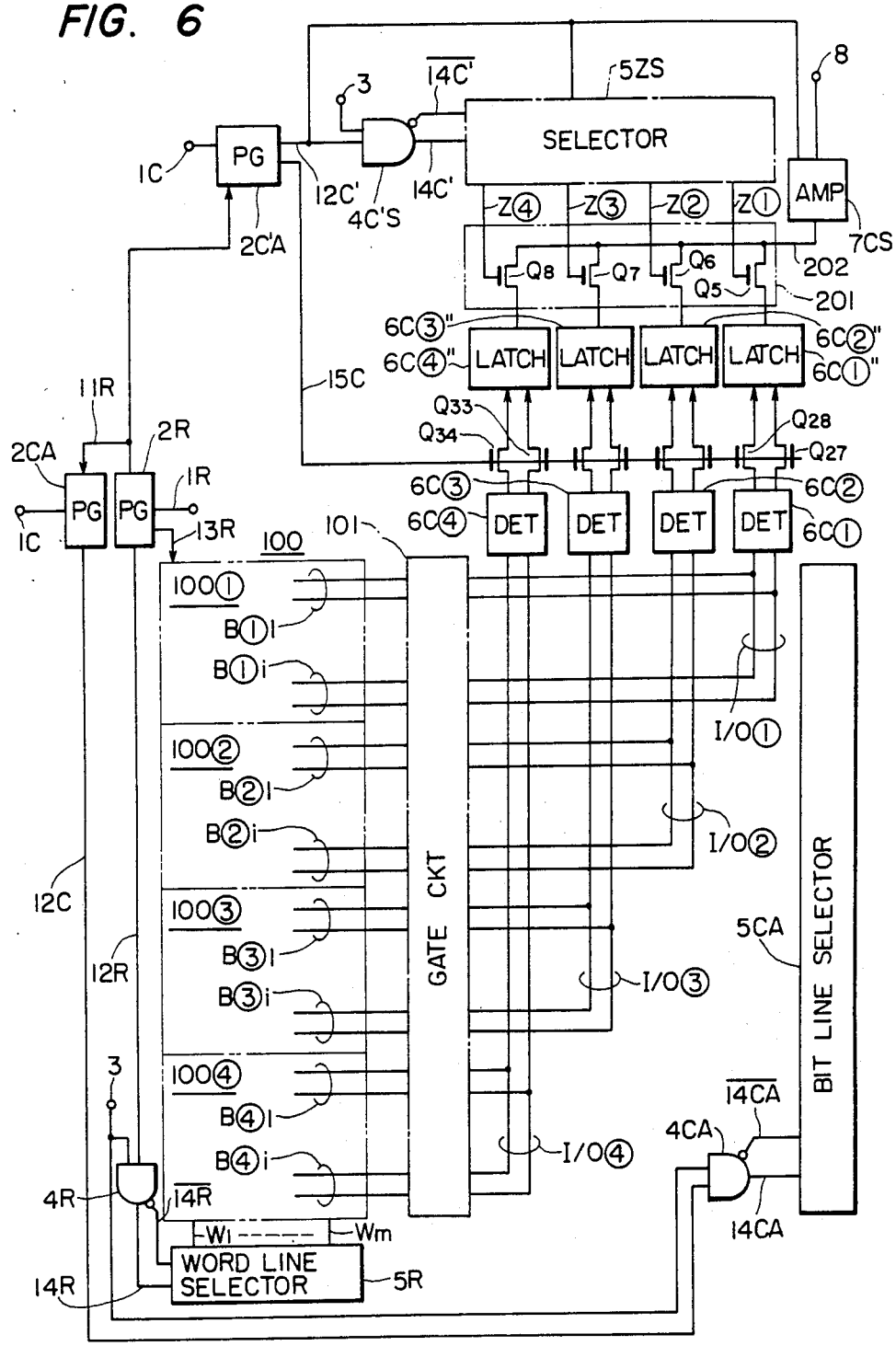
FIG. 6 shows an embodiment of the present invention which operates on the basis of the combination of a continuous mode and a page mode.

FIG. 6 shows an embodiment of a memory which operates in a mode with the continuous mode and the page mode combined. In FIG. 6, the same reference symbols as in FIG. 3 indicate the same parts. For the sake of brevity, parts concerning the writing of data are omitted from the illustration of FIG. 6.

The embodiment of FIG. 6 is mainly different from that of FIG. 3 in the following points. MOS transistors $Q_{27}$–$Q_{34}$ for cut-off and latch circuits of the dynamic type $6C_1''$–$6C_4''$ for temporarily storing data are disposed, and the circuit 2C′ in FIG. 3 is replaced with a circuit 2C′A. Various arrangements are considered for the latch circuits $6C_1''$–$6C_4''$, and and example will be described later with reference to FIG. 13. The circuit 2C′A is identical to the circuit 2C′ in FIG. 3 in point of responding to the first fall of the signal 1C to deliver its inverted signal 12C′, but is different from the latter in point of not responding to the subsequent level changes of the signal 1C while the signal 11R is at the high level. Further, the circuit 2C′A differs from the circuit 2C′ in FIG. 3 in point of delivering a signal 15C which becomes its high level upon lapse of a predetermined period after the fall of the signal 1C. The transistors $Q_{27}$–$Q_{34}$ are turned "off" under the control of the signal 15C after the detection data of the detectors 6C 1 –6C 4 have been loaded into the latch circuits 6C 1 "–6C 4 ". In this manner, these transistors have the function of cutting off the latch circuits 6C 1 "–6C 4 " from the detectors 6C 1 –6C 4 .

Figure 7:
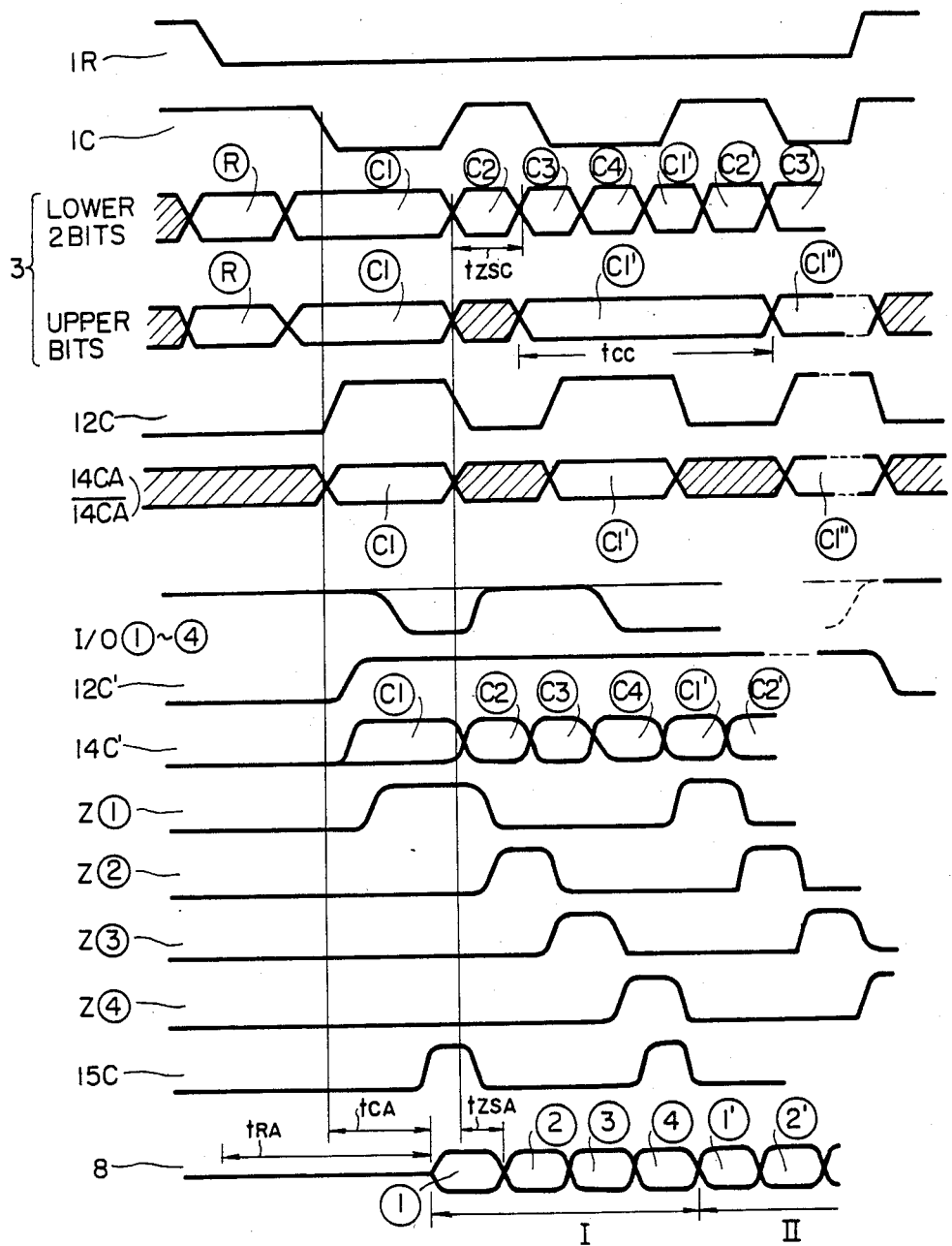
FIG. 7 is a time chart showing the operation of the memory in FIG. 6.

Referring now to FIG. 7, the operation of the memory in FIG. 6 will be described.

The operation till the time when data are read out onto the data line pairs I/O 1 –I/O 4 on the basis of the head address C1 of the first set of addresses, is the same as in the embodiment in FIG. 3.

Each of the detectors 6C 1 –6C 4 differentially amplifies the voltages of the corresponding one of the data line pairs I/O 1 –I/O 4 , and it delivers a pair of signals of different levels as the detection data in accordance with the amplified results.

At the time when the differential amplification operations by the detectors 6C 1 –6C 4 end, the signal 15C falls into the high potential state, and through the transistors $Q_{27}$–$Q_{34}$, the latch circuits 6C 1 "–6C 4 " are latched into statuses corresponding to the paired signals delivered from the respective detectors 6C 1 –6C 4 . One of outputs from the latch circuits 6C 1 "–6C 4 ", for example, an output from the latch circuit 6C 1 " is selected by the selector 5ZS responsive to the address C1 , whereupon it is delivered as a data 1 from the output amplifier 7CS. It is expected that by subsequently and successively altering the column address to be applied through the lines 3 into the addresses C2 – C4 , data 2 – 4 are permitted to be delivered in the continuous mode on the basis of the outputs of the latch circuits 6C 2 "–6C 4 ".

In this embodiment, in order to start the page mode operation in parallel with the continuous mode operation, the signal 1C is brought into the high potential state after the latch operations for the latch circuits 6C 1 "–6C 4 " have been finished. As a result, the signal 15C is brought back to the original low potential by the circuit 2C'A, and the transistors $Q_{27}$–$Q_{34}$ are turned "off". Thus, the latch circuits 6C 1 "–6C 4 " are cut off from the detectors 6C 1 –6C 4 . Simultaneously, as in the case of the page mode in the prior art, the circuits concerning the column selecting operation, i. e., the buffer 4CA, bit line selector 5CA, data line pairs I/O 1 –I/O 4 and detectors 6C 1 –6C 4 are reset into the stand-by status of the memory by the circuit 2CA in response to the high level of the signal 1C.

When the resetting operation of the column selecting circuits has been started, he continuous mode operation on the address C2 is performed independently of this resetting operation, and hence, the next column address C2 is applied through the lines 3 at the timing at which the output amplifier 7CS has delivered the data 1 . In this regard, only the lower 2 bits of the address C2 may be applied. The reason is as follows. Since the buffer 4CA has been brought into the stand-by state with the rise of the signal 1C, it does not respond to the address on the lines 3. Accordingly, the upper bits of the address C2 need not be applied. As will be described later, this holds for the applications of the ensuing column addresses C3 and C4 . As a result, it suffices to apply only the upper bits of the address C1 among all the upper bits of the addresses C1 – C4 .

In order to permit the continuous mode operation even while the signal 1C is at the high level, the circuit 2C'A holds the signal 12C' at the high level during the low level of the signal 11R even when the signal 1C returns to the high level. In this way, the continuous mode operation is performed on the basis of the lower 2 bits of the address C2 in parallel with the resetting operation of the column selecting circuits, and the data 2 is read out.

Supposing that the resetting operation of the circuits concerning the column selecting operation has ended at the time when the output amplifier 7CS has delivered the data 2 and the continuous mode operation has been stated on the basis of the address C3 , it is desired for starting the next column selecting operation immediately at the aforementioned time that the reception of the head address C1' of the second set of addresses C1' , C2' ... by making the signal 1C the low potential again at the aforementioned time. To this end, the address C1' and the address C3 need to be simultaneously applied through the lines 3. Since only the 2 lower side bits of the column address may be used for the continuous mode operation, the 2 lower side bits of the address C3 are externally sent through two of the lines 3 on the lower bit side thereof, and the upper side bits of the address C1' other than the 2 lower side bits thereof are applied through the remaining lines of the lines 3.

When the continuous operation based on the 2 lower side bits of the address C3 has ended, only the 2 lower side bits are similarly applied through the lines 3 as to the address C4 . Meantime, the memory executes the column selecting operation in response to the upper side bits of the address C1' since the return of the signal 12C to the high level, so that the voltages of the input/output data line pairs I/O 1 – 4 change and that the detectors 6C 1 – 4 operate. It is supposed that the output amplifier 7CS finishes the delivery of the data 3 and 4 for the addresses C3 and C4 before the operations of the detectors 6C 1 – 4 end after the return of the signal 1C to the low level. Then, at the end of the operations of the detectors 6C 1 – 4 , the signal 1C is made the high level again. Besides, the signal 15C becomes the high level for a predetermined period. As a result, the data of the I/O line pairs I/O 1 – 4 read out on the basis of the upper side bits of the address C1' are loaded into the latch circuits 6C 1 "–6C 4 ". In this way, the continuous operation based on the addresses C1' , C2' ... is started, and data 1' , 2' ... are read out to the terminal 8.

When, upon end of the continuous operation based on the address C2' , the continuous operation based on the next address C3' is to be started, the signal 1C is made the low level and the upper side bits of the head address C1" of the third set of addresses are applied to the upper bit side lines of the lines 3 in order to perform the continuous operation for the third set of addresses C1" , ....

Thenceforth, similar operations are repeated.

In this manner, the data are continuously read out in the combined mode of the continuous mode and the page mode. When the read-out of the data has been finished, both the signals 1C and 1R are made the high levels, and all the circuits within the memory are restored into the stand-by states.

As stated above, in this embodiment, each time the signal IC becomes the low level, the operations till the end of the operations of the detectors 6C 1 – 4 are carried out. Each time four data are provided by such operations, they are continuously delivered to the terminal 8. Thus, data can be derived from the terminal 8 continuously without intermission.

While the above description concerns only the read-out operation, writing can of course be similarly effected. In case of the writing, it is unfavorable that the address of a bit to be written in changes during the operation. Therefore, the write address may be applied in the cycle of the next page mode.

In this embodiment, the upper side bits of the head address C1' of the second set of addresses are received when the 2 lower side bits of the address C3 are received. However, this changes variously depending upon the operating speed of the memory or designs, and the aspect of the embodiment is not restrictive. Needless to say, the number k of data to be continuously read out is not restricted to 4 but can be altered variously. In addition, when the cycle time $t_{CC}$ of the page mode and the cycle time $t_{ZSC}$ during the continuous operation are put into the relationship of $t_{CC} \leq k \cdot t_{ZSC}$, at least k data can be derived continuously without a time gap. Even when $t_{CC} > k \cdot t_{ZSC}$ holds, merely a slight time gap appears, and the effectiveness of this embodiment is not spoilt.

The quantity of data which can be read out/written in continuously at high speed by this embodiment is $j \times k$ where j denotes the number of the page modes. It is sharply increased over the value of the foregoing embodiment. That is, according to this embodiment, the high-speed continuous reading/writing which requires a time of ½-1/5 of that of the page mode in the prior art is permitted with substantially the same operating format as the page mode in the prior art.

The above operation of the combined mode of the continuous mode and the page mode is also realizable in a memory constructed of dynamic circuits.

Before describing such an embodiment, there will be explained the outline of a memory which is constructed only of dynamic circuits and which performs only the continuous mode operation similarly to the memory of FIG. 3.

Figure 8:
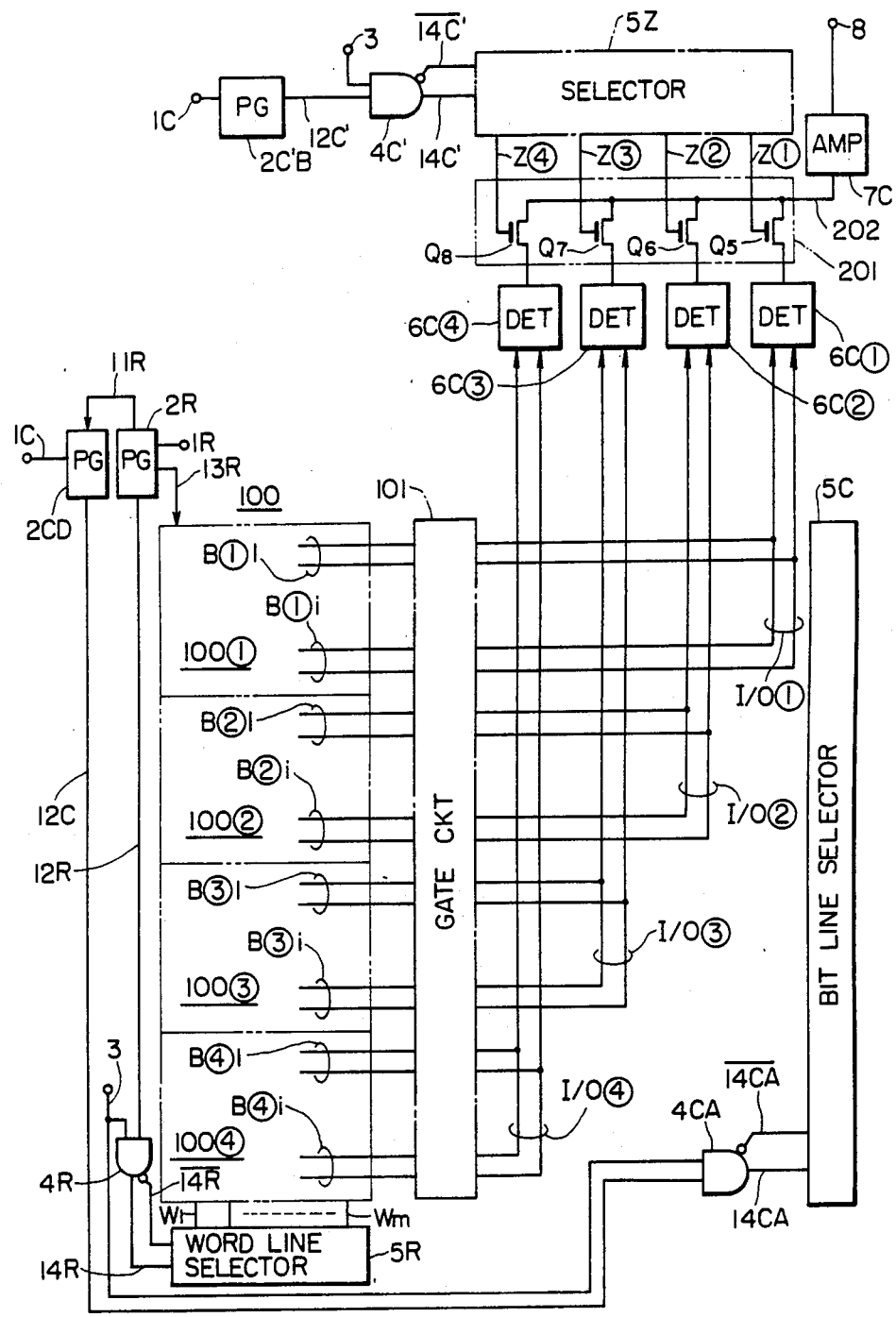
FIG. 8 is an arrangement diagram of a memory which is constructed of only dynamic circuits and which operates in the continuous mode.

The memory in FIG. 8 is chiefly different from the memory in FIG. 3 in the point that the buffer 4C'S, selector 5ZS and output amplifier 7CS in FIG. 3 are respectively substituted by a buffer 4C', selector 5Z and output amplifier 7C of the dynamic type and also in the point that the pulse generators 2CA and 2C' in FIG. 3 are respectively substituted by pulse generators 2CD and 2C'B. The input data buffer 10CS shown in FIG. 3 is also substituted by a dynamic circuit, but parts concerning the writing of data are omitted from the illustration of FIG. 8 for the sake of brevity.

The circuit 2CD is identical to the circuit 2CA in FIG. 3 in point of delivering the inverted signal 12C of the signal 1C in response to the fall of the signal 1C only when this signal 1R is at the low level, that is, when the signal 11R is at the high level. However, the former is different from the latter in that only when the signal 11R is at the low level, the former responds to the rise of the signal 1C to carry out the operation of inverting the level of the signal 12C and the operation of generating a signal for precharging the circuits relevant to the column selecting operation at this time.

The circuit 2C'B is identical to the circuit 2C' in FIG. 3 in point of changing the level of the inverted output 12C' each time the level of the signal 1C is inverted, but the former is chiefly different from the latter in point of generating a precharging signal for bringing the buffer 4C', selector 5Z and output buffer 7C into the stand-by states each time the signal 1C rises.

Figure 9:
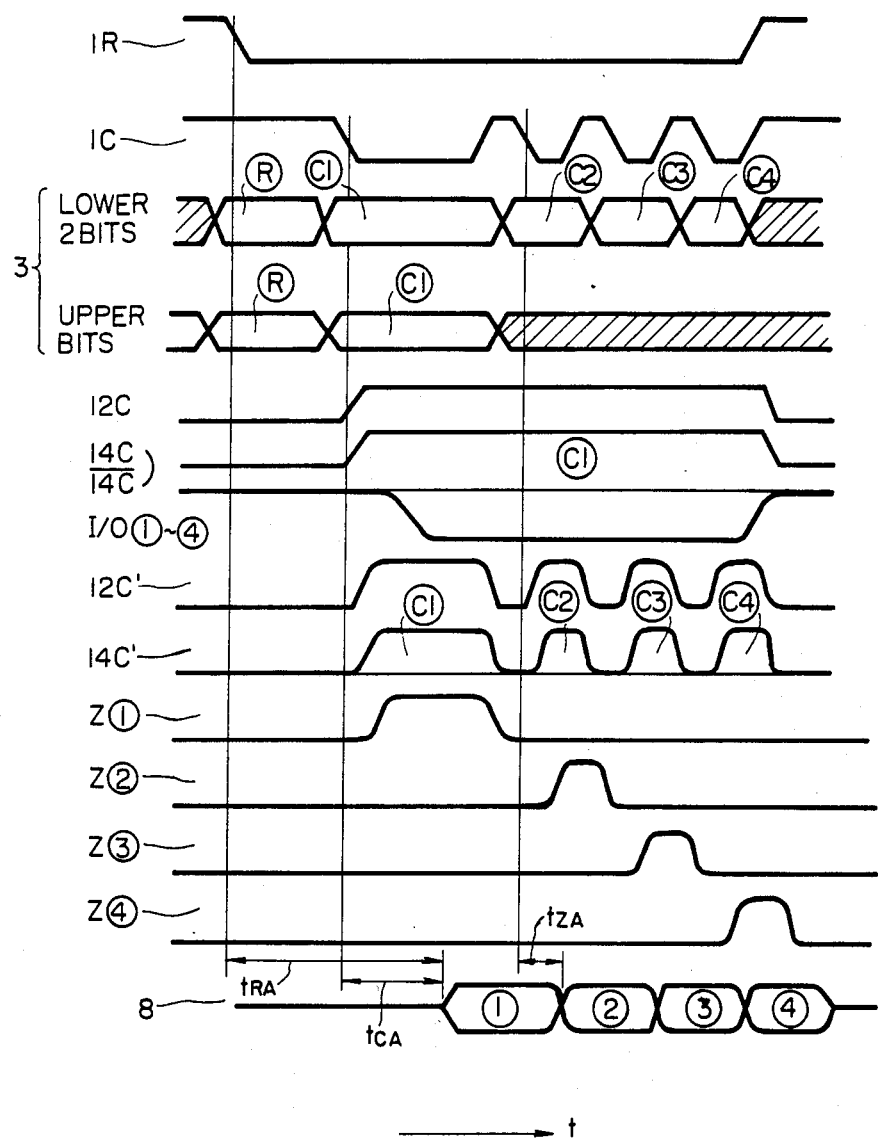
FIG. 9 is a time chart showing the operation of the memory in FIG. 8.

FIG. 9 is a time chart showing the operation of the memory of FIG. 8. As apparent from FIG. 9, in the column selecting operation based on the column address R and the row selecting operation based on the row address C1, the operations up to the delivery of the first data 1 are quite the same as in the memory of FIG. 3.

In the memory of FIG. 8, the signal 1C is raised at the time when the output amplifier 7C has provided the data 1. Accordingly, the buffer 4C', selector 5Z and output amplifier 7C are precharged back into the stand-by states by the circuit 2C'B. Since, at this time, the signal 11R is at the high level, the circuit 2CD does not respond to the rise of the signal 1C at all. Therefore, the buffer 4CA, bit line selector 5C and detectors 6C 1 - 4 hold the states till then without being precharged.

At the time when the first data 1 has been delivered from the output amplifier 7C, the signal 1C is raised. In response to the rise of the signal 1C, the circuit 2C'B generates a signal (signal lines therefor being omitted from the illustration) for precharging the circuits 4C', 5Z and 7C relevant to the continuous mode into the stand-by states, and it also brings the signal 12C' into the low level. Before these circuits revert into the stand-by states, the 2 lower bits of the next column address C2 are applied through the lines 3. It is to be understood that, at this time, even when the upper bits of the address C2 are applied through the lines 3, the circuit 4CA does not respond thereto, so the application of the upper bits through the lines 3 is meaningless. Upon end of the reversion into the stand-by states, the signal 1C is brought into the low level. The circuit 2C'B responds to this low level to stop the transmission of the precharging signal and to bring the signal 12C' into the high level. At the rise of the signal 12C', the buffer 4C receives the 2 lower bits of the address C2 and delivers the corresponding internal address signals 14C' and $\overline{14C'}$. Thereafter, as in the case of the address C1, the output of the detector 6C 2 is selected by the selector 5Z, and the data 2 is delivered from the output amplifier 7C. Thenceforth, in the same manner, the 2 lower bits of the addresses C3 and C4 are successively applied, and the data 3 and 4 are successively delivered. Thereafter, both the signals 1C and 1R are made the high levels, and the circuit 2R responds to the rise of the signal 1R to precharge the circuit 5R, cell array 100 etc. relevant to the row selection and to restore them into the stand-by states. At this time, the signal 11R becomes the low level, and in response to the low level of the signal 11R and the high level of the signal 1C, the circuit 2CD generates a signal for precharging the circuits 4CA, 5C and 6C 1 - 4 relevant to the column selection and further brings the signal 12C to the low level.

In this way, the data 1 - 4 can be read out in the continuous mode by the use of the dynamic circuits. The memory of FIG. 8 may be considered to differ from the memory of FIG. 3 effecting the continuous mode with the static circuits, in the point that each time one data is provided, the circuits relevant to the continuous mode are precharged back into the stand-by states. Accordingly, the memory which operates in the combined mode of the continuous mode and the page mode can be readily constructed as shown in FIG. 10 on the basis of FIG. 6.

Figure 10:
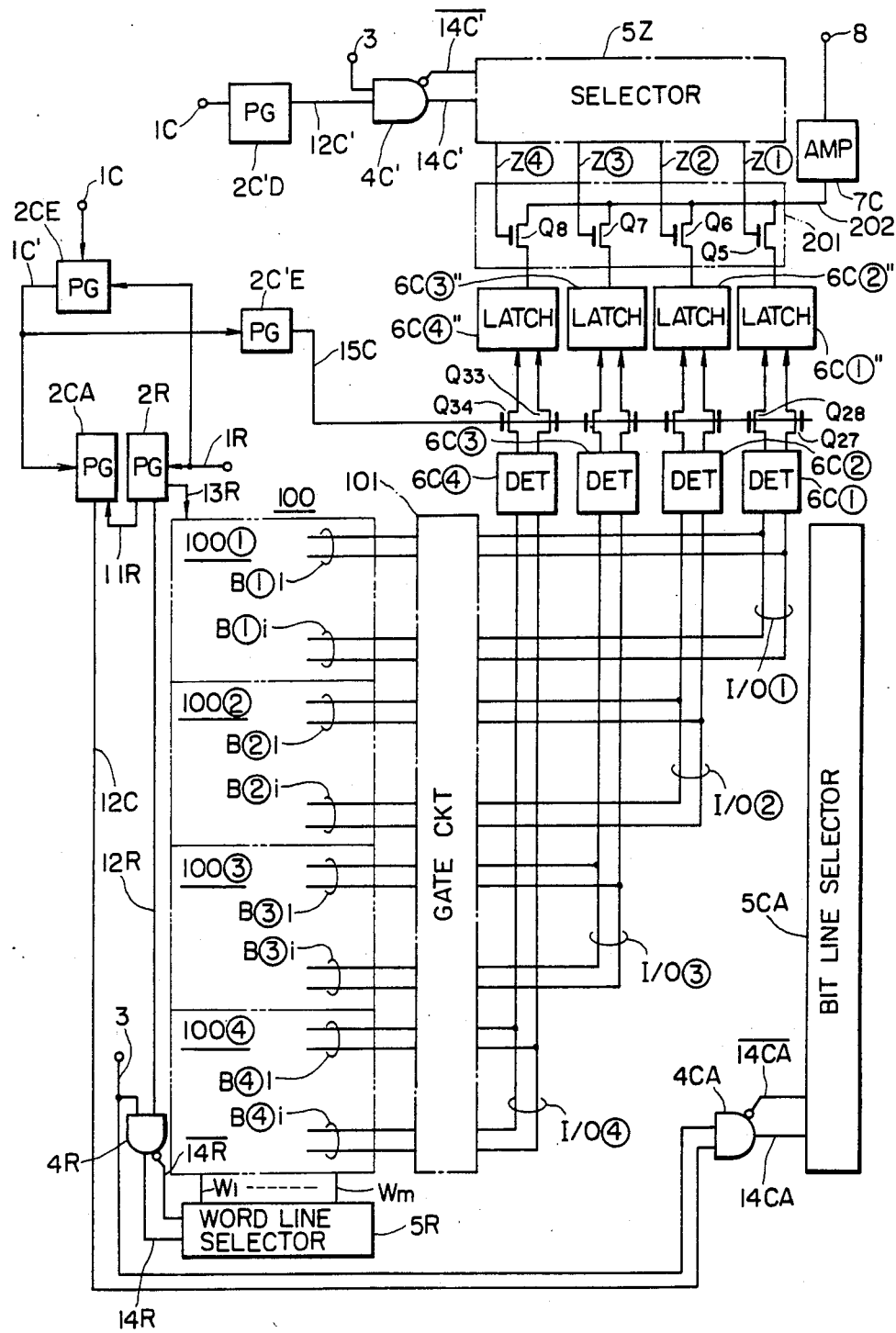
FIG. 10 shows an embodiment of the present invention which operates on the basis of the combination of the continuous mode and the page mode.
Figure 11:
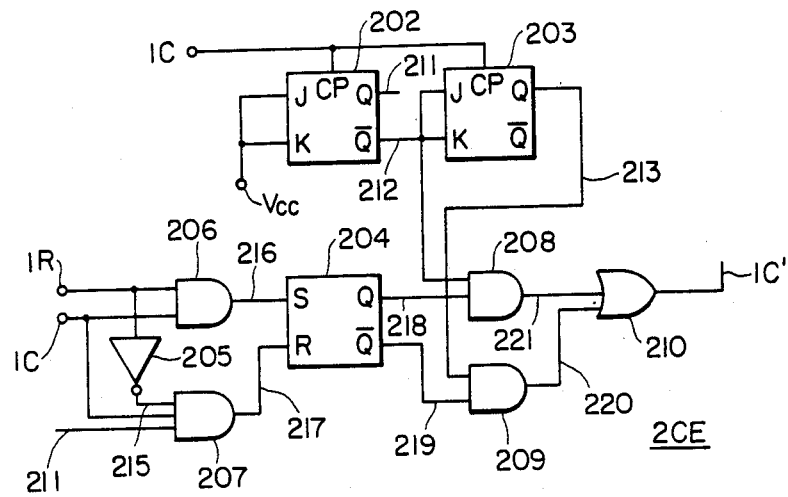
FIG. 11 is an arrangement diagram of a pulse generator for use in the memory of FIG. 10.

The memory of FIG. 10 differs from the memory of FIG. 6 only in points of employing the buffer 4C′, selector 5Z and output amplifier 7C of the dynamic type used in the memory of FIG. 8, replacing the pulse generator 2CD in FIG. 8 with the pulse generator 2CA used in the memory of FIG. 6 and a circuit 2CE shown in detail in FIG. 11, and replacing the pulse generator 2C′A in FIG. 6 with a pulse generator 2C′D generating the signal 12C′ in response to the signal 1C and a circuit 2C′E generating the signal 15C in response to the output of the circuit 2CE.

Figure 12:
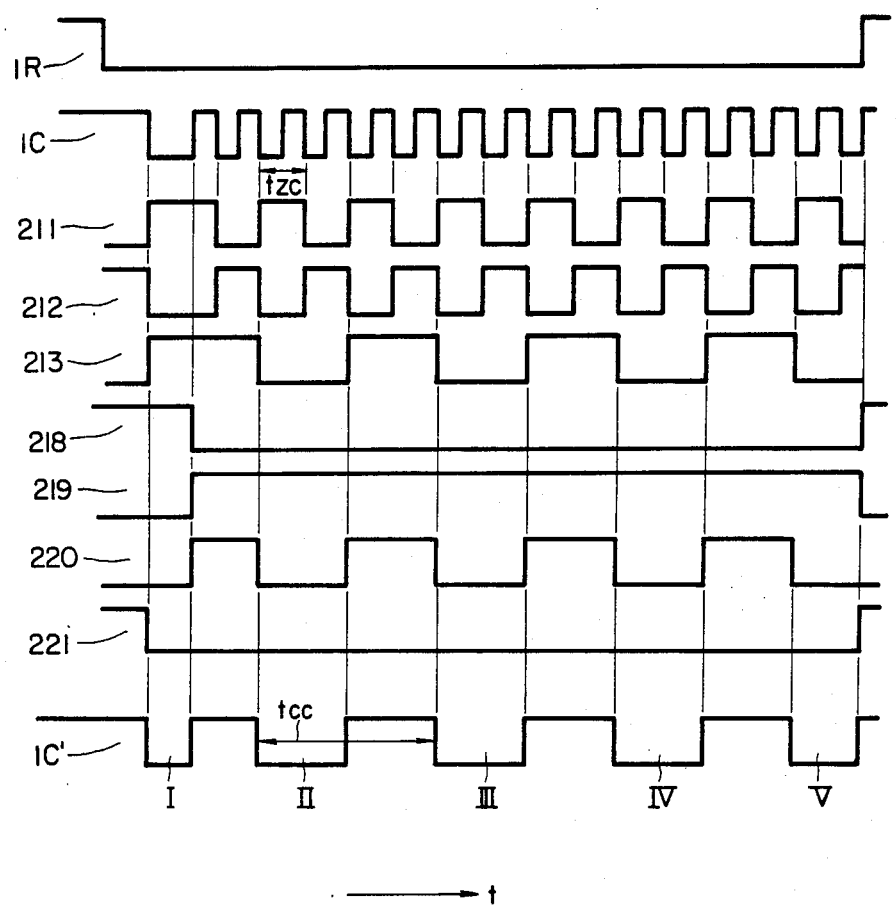
FIG. 12 is a time chart showing the operation of the circuit in FIG. 11.

The circuit 2CE is a circuit which delivers a signal 1C′ in response to the signal 1C when the signal 1R is at the low level. As shown in FIG. 12, the signal 1C′ falls in response to the first fall of the signal 1C (interval I), and it falls once in the period of time in which the signal 1C falls four times with the first fall included (intervals II–V). As will be described later, the signal 1C′ may fall the number of times equal to $\frac{1}{4}$ of the total number of times of the fall of the signal 1C, and the fall in the interval V is not always necessary. Here, numbers 4 and $\frac{1}{4}$ denote the number k of data to be read out in the continuous mode and the inverse number thereof, respectively.

In FIG. 11, numerals 202 and 203 designate circuits for dividing the frequency of the signal 1C into $\frac{1}{4}$ (that is, 1/k). Here, an example employing the well-known J-K flip-flop is shown. It is, of course, possible to construct them by the use of flip-flops of the other types, for example, the D type. Used as the J-K flip-flop is one whose status is inverted by the fall part of the signal 1C applied as a clock pulse Cp (Negative Edge Trigger Type). Numeral 204 designates an S-R flip-flop which recognizes the start time of an operation and the status of which is inverted by the rise parts of input signals S and R. In the respective flip-flops, there is not illustrated the function of resetting (or setting) them into the initial statuses in order that even in such a case where the memory operations are ceased halfway, the normal operations may be started in the next cycle. This applies also to the following embodiments. Numeral 205 indicates an inverter, numerals 206–209 AND circuits, and numeral 210 an OR circuit.

The non-inverted output 218 of the flip-flop 204 rises when both the signals 1R and 1C have become the high potential (at the end of the operation), and falls at the time when the operation is started (with the signal 1R at the low potential) and the signal 1C rises for the first time. The inverted output 212 of the flip-flop 202, the non-inverted output 213 of the flip-flop 203, the signal 218 and the inverted output 219 of the flip-flop 204 are subjected to logic operations by gates 208–210 so as to form the signal 1C′.

As a result, as shown in FIG. 12, the signal 1C′ becomes the low level in the interval I of the first low level of the signal 1C and in the intervals II–V from the points of time when the signal 1C becomes the low level the $(3+4\alpha)$-th time ($\alpha=0, 1, 2\ldots$) to the points of time when the signal 1C begins to become the low level the $(5+4\alpha)$-th time.

This signal 1C′ is applied to the circuit 2CA. While the signal 1C has been applied to the circuit 2CA in FIG. 6, the signal 1C′ is applied to the circuit 2CA in FIG. 10 in lieu of the signal 1C.

The circuit 2C′D differs from the circuit 2C′B in FIG. 8 in only the point that the former does not have a circuit part for generating the signal 15C. The circuit 2C′E is made up of that part of the circuit 2CA in FIG. 8 which generates the signal 15C. It is connected to the circuit 2CE so as to generate the signal 15C in response to the output 1C′ of the circuit 2CE.

Figure 13:
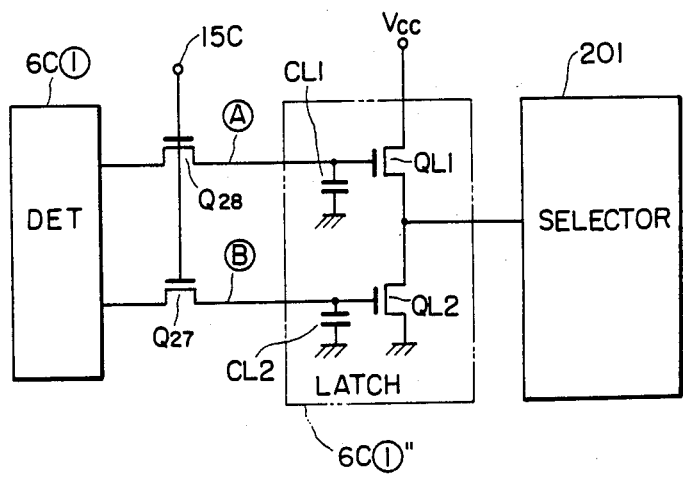
FIG. 13 is an arrangement diagram of a latch circuit for use in the memory of FIG. 10.

FIG. 13 shows an example of arrangement of the latch circuit 6C 1 ″. Needless to say, the other latch circuits 6C 2 -6C 3 ″ are similarly arranged. As stated before, the circuit arrangement shown here is also applicable to the memory of FIG. 6. As shown in FIG. 13, the latch circuit is composed of transistors $Q_{L1}$ and $Q_{L2}$ and capacitors $C_{L1}$ and $C_{L2}$. When the signal 15C has become the high potential, the transistors $Q_{27}$ and $Q_{28}$ turn "on", and the output signals of the detector 6C 1 are transmitted to nodes A and B . When the signal 15C has become the low potential, the transistors $Q_{27}$ and $Q_{28}$ turn "off", and the aforementioned signals are confined to the nodes A and B and are respectively held in the capacitors $C_{L1}$ and $C_{L2}$ in the form of charges. That is, the output signals of the detector 6C 1 are latched. At this time, the signals of the nodes A and B are the inverted signals of the others mutually, and either of the transistors $Q_{L1}$ and $Q_{L2}$ turns "on" in accordance with the signals of the nodes A and B . When the node A is at the high potential (that is, the node B is at the low potential), the transistor $Q_{L1}$ turns "on" and $Q_{L2}$ "off", so that the high potential is delivered to the selector 201. When the node A is at the low potential (that is, the node B is at the high potential), the transistor $Q_{L1}$ turns "off" and $Q_{L2}$ "on", so that the low potential is delivered to the selector 201.

As explained above, the transistors $Q_{L1}$ and $Q_{L2}$ do not turn "on" simultaneously, and any wasteful power dissipation is prevented. The signals to be latched are changed only by the signal 15C, and a signal for returning this circuit into the stand-by state is not especially required. It is a matter of course that, in order to normally operate the latch circuit, the detector 6C 1 -6C 4 needs to have a drivability sufficient for the charging and discharging of the capacitors $C_{L1}$ and $C_{L2}$.

Figure 14:
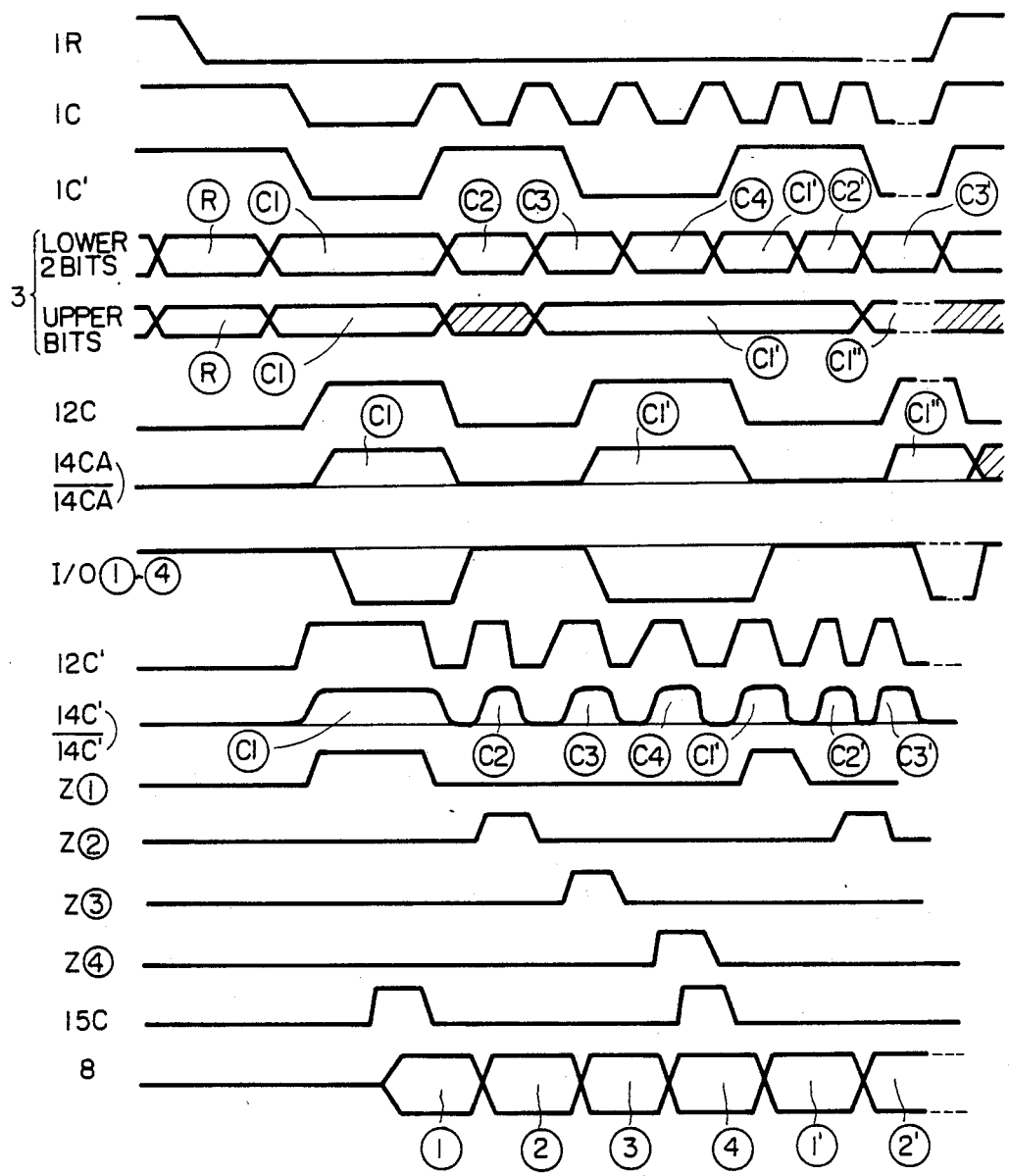
FIG. 14 is a time chart showing the operation of the memory in FIG. 10.

Referring now to FIG. 14, the operation of the memory in FIG. 10 will be described.

When the signal 1C has first become the low level subject to the low level of the signal 1R, the signal 1C′ becomes the low level synchronously. In response to the first fall of the signal 1C′, the column selecting operation is performed quite similarly to the case of FIG. 6, and detected data are set in the latch circuits 6C 1 ″-6C 4 ″. On the other hand, in response to the fall of the signal 1C, the circuit 2C′D ceases the precharging of the buffer 4C′, selector 5Z and output amplifier 7C and brings the signal 12C′ to the high level. In response to the rise of the signal 12C′, the continuous mode operation based on the 2 lower bits of the addresses C1 – C4 is started quite similarly to the case of FIG. 8, and the data 1 is read out from the terminal 8. Herein, in order to turn "on" the MCS transistors $Q_{27}$–$Q_{34}$ at the time when the data have been read out to the data line pairs I/O 1 – 4 , there is disposed the circuit 2C′E which brings the signal 15C to the high level in synchronism with the start of the column selecting operation. In order to execute the page mode in parallel with the continuous mode, the signal 1C′ is raised when the signal 1C has first risen. In response to the rise of the signal 1C′, the circuit 2CA delivers the signal for restoring the circuits 4CA, 5CA and 6C 1 – 4 relevant to the column selecting operation into the precharged stand-by states. Under the execution of the operation of restoring the circuits into the stand-by states, the signal 1C is repeatedly changed, and the continuous mode operation based on the addresses C2 - C4 is continued in the same way as in FIG. 8. It is now assumed that the restoring operation has been finished before the continuous mode operation based on the column address C3 is started. When the 2 lower bits of the address C3 are applied through the lines 3, the upper bits of the head address C1' of the next set of four addresses C1' - C4'. When the signal 1C has thereafter fallen, the column selecting operation based on the address C1' is started. Meantime, the continuous mode operation based on the address C3 is carried out in parallel. Thenceforth, the page mode and the continuous mode are executed in parallel in the same way as in the case of FIG. 6. In case of FIG. 10, the circuits 4C', 5Z and 7C relevant to the continuous mode operation are of the dynamic type. Therefore, the operation of the memory in FIG. 10 differs from that of the memory in FIG. 6 in point of requiring the operation of precharging these circuits into the stand-by states by means of the circuit 2C'D as in the case of FIG. 8 each time the continuous mode operation is finished in response to the lower 2 bits of the column address C1 - C4.

Accordingly, the memory of FIG. 10 is lower in the operating speed than that of FIG. 6 to the extent of the period of time required for the precharging operation. Since, however, all of the circuits of the former are of the dynamic type, the former can be made lower in the power dissipation than the latter. This also applies to the comparison between the respective memories in FIG. 3 and FIG. 6.

(3) Row Continuous Mode

Figure 15:
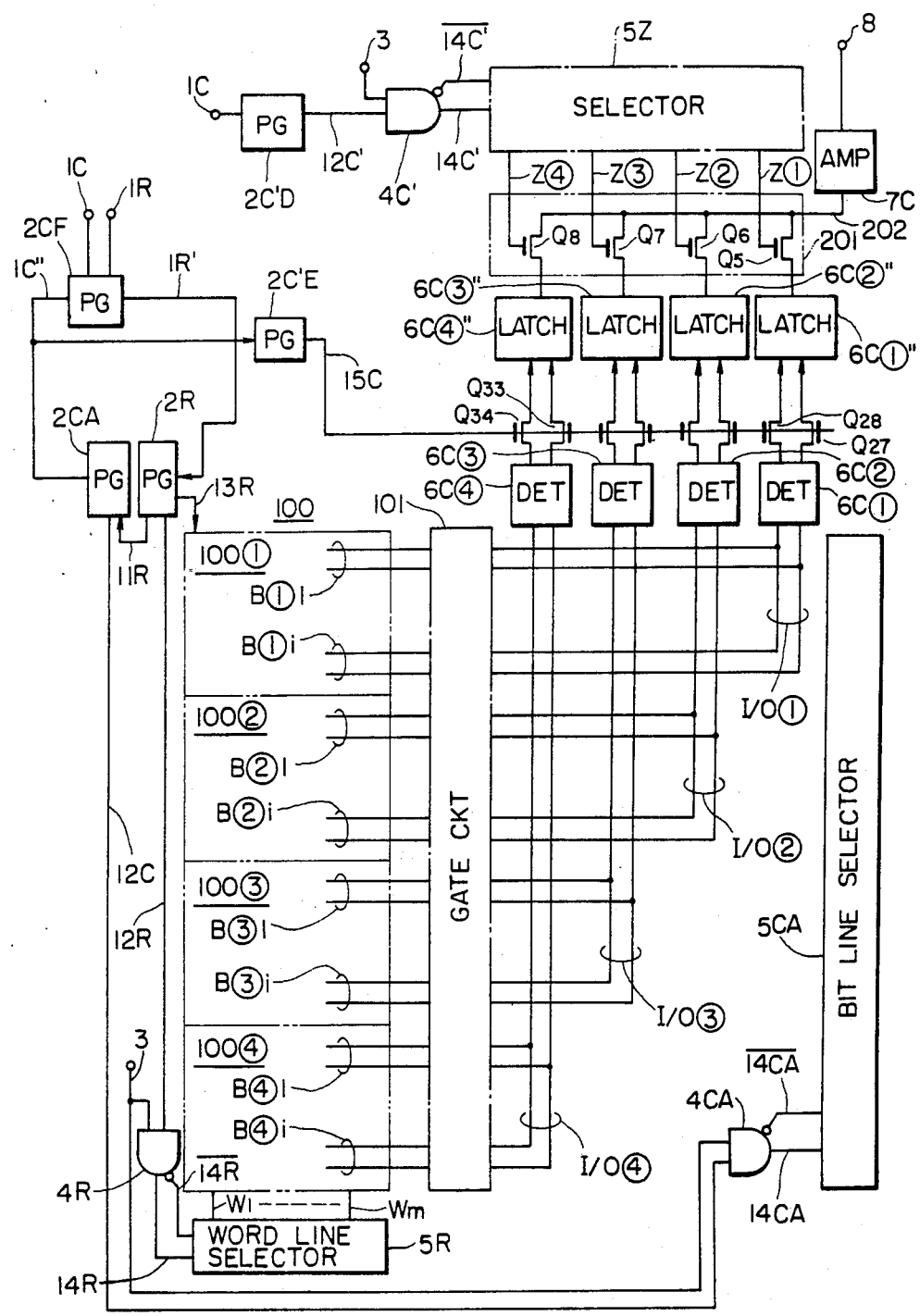
FIG. 15 shows an embodiment of the present invention which continuously performs the continuous mode, the page mode and a row selecting operation.

With the above embodiment, the j×k data are permitted to be handled at high speed and continuously as stated before. This quantity of data is limited to a range appointed by one row selection address. An embodiment to be described below is such that the foregoing concept, i.e., the concept of operating the other circuits during the continuous operation and thus effecting the mere continuous operation without intermission is further expanded so as to perform both the row selecting and column selecting operations and to read out all the data of the memory at high speed and continuously. FIG. 15 shows the embodiment, which is a memory constructed of dynamic circuits similarly to the embodiment of FIG. 10.

Figure 16:
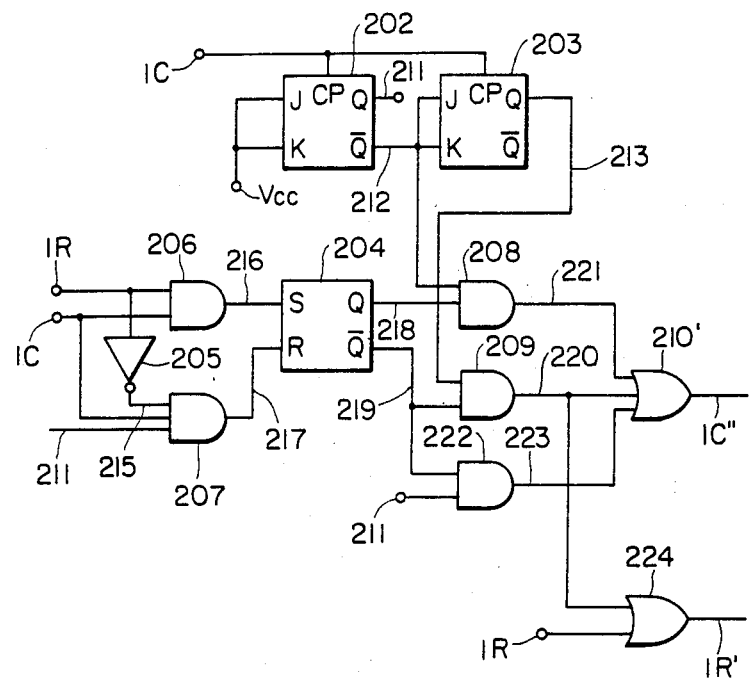
FIG. 16 is an arrangement diagram of a pulse generator for use in the memory of FIG. 15.

The memory of FIG. 15 differs from the memory of FIG. 10 in that a circuit 2CF shown in detail in FIG. 16 is used instead of the pulse generator 2CE in FIG. 10, and that signals 1C'' and 1R' formed by a circuit 2CF are respectively applied to the circuits 2CA and 2R instead of the signals 1C' and 1R in FIG. 10.

Figure 17:
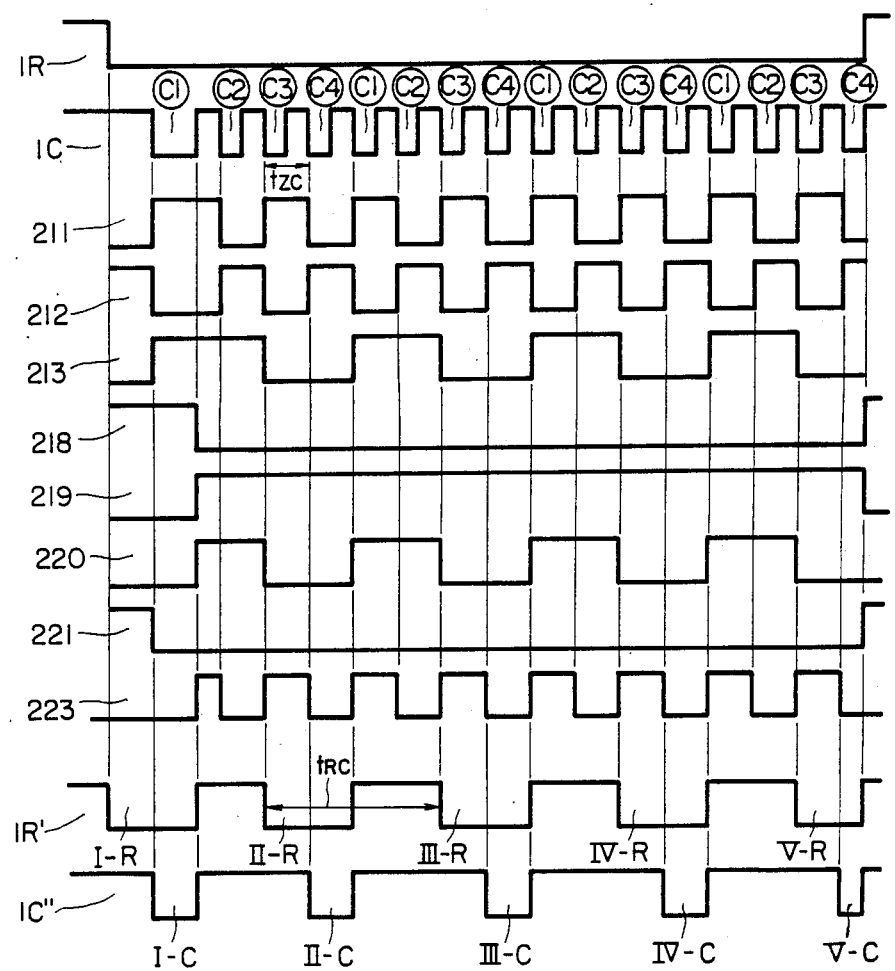
FIG. 17 is a time chart of the operation of the circuit in FIG. 16.

The circuit 2CF is a circuit which delivers the signals 1R' and 1C'' in response to the signal 1C when the signal 1R is at the low level. As shown in FIG. 17, the signal 1R' falls in response to the first fall of the signal 1R (interval I-R), and it falls once in the period of time in which the signal 1C falls four times with the first fall included (intervals II-R to V-R).

Likewise to the signal 1R', the signal 1C'' falls in response to the fall of the signal 1C (interval I-C), and it falls once in the period of time in which the signal 1C falls four times with the first fall included (intervals II-C to V-C). As apparent from FIG. 17, however, the signal 1R' and the signal 1C'' are different in that the time interval during which the former lies at the low level is equal to 2 cycles of the signal 1C, whereas the time interval of the latter is equal to 1 cycle of the signal 1C. The time relation mentioned here is of an example in which the high-speed continuous operation ( C1 - C4 ) is performed at k=4, and it is, of course, altered properly in correspondence with the number k.

The signal 1R' or 1C'' may fall the number of times equal to $\frac{1}{4}$ of the total number of times of the fall of the signal 1C, and the fall in the interval V-R or -C is not always necessary. Here, numbers 4 and $\frac{1}{4}$ denote k and $1/k$, respectively.

In FIG. 16, the same parts as in the circuit 2CE shown in FIG. 11 are indicated by the same symbols. The circuit 2CF in FIG. 16 differs from the circuit 2CE in FIG. 11 in the points that an AND circuit 222 and an OR circuit 224 are added and that a 3-input OR circuit 210' is substituted for the 2-input OR circuit 210.

The flip-flops 202 to 204 perform the same operations as explained before. Their outputs are subjected to logic operations by the gates 208–210', 222 and 224 so as to form the signals 1R' and 1C'' already explained. As a result, as shown in FIG. 17, the signal 1R' becomes the low level in the interval I-R from the point of time when the signal 1R becomes the low level to the point of time when the signal 1C rises first and also in the intervals II-R to V-R from the points of time when the signal 1C becomes the low level the $(3+4\alpha)$-th time ($\alpha=0, 1, 2...$) to the points of time when the signal 1C begins to become the low level the $(5+4\alpha)$-th time. On the other hand, the signal 1C'' becomes the low level in the interval I-C of the first low level of the signal 1C and in the intervals II-C to V-C from the points of time when the signal 1C becomes the low level the $(4+4\alpha)$-th time to the points of time when the signal 1C begins to become the low level the $(5+4\alpha)$-th time.

The signal 1R' formed in the above way is applied to the circuit 2R, and the signal 1C'' to the circuit 2CA. In FIG. 10, the signal 1R is applied to the circuit 2R and the signal 1C' to the circuit 2CA, whereas in FIG. 15, the signal 1R' is applied to the circuit 2R and the signal 1C'' to the circuit 2CA.

Figure 18:
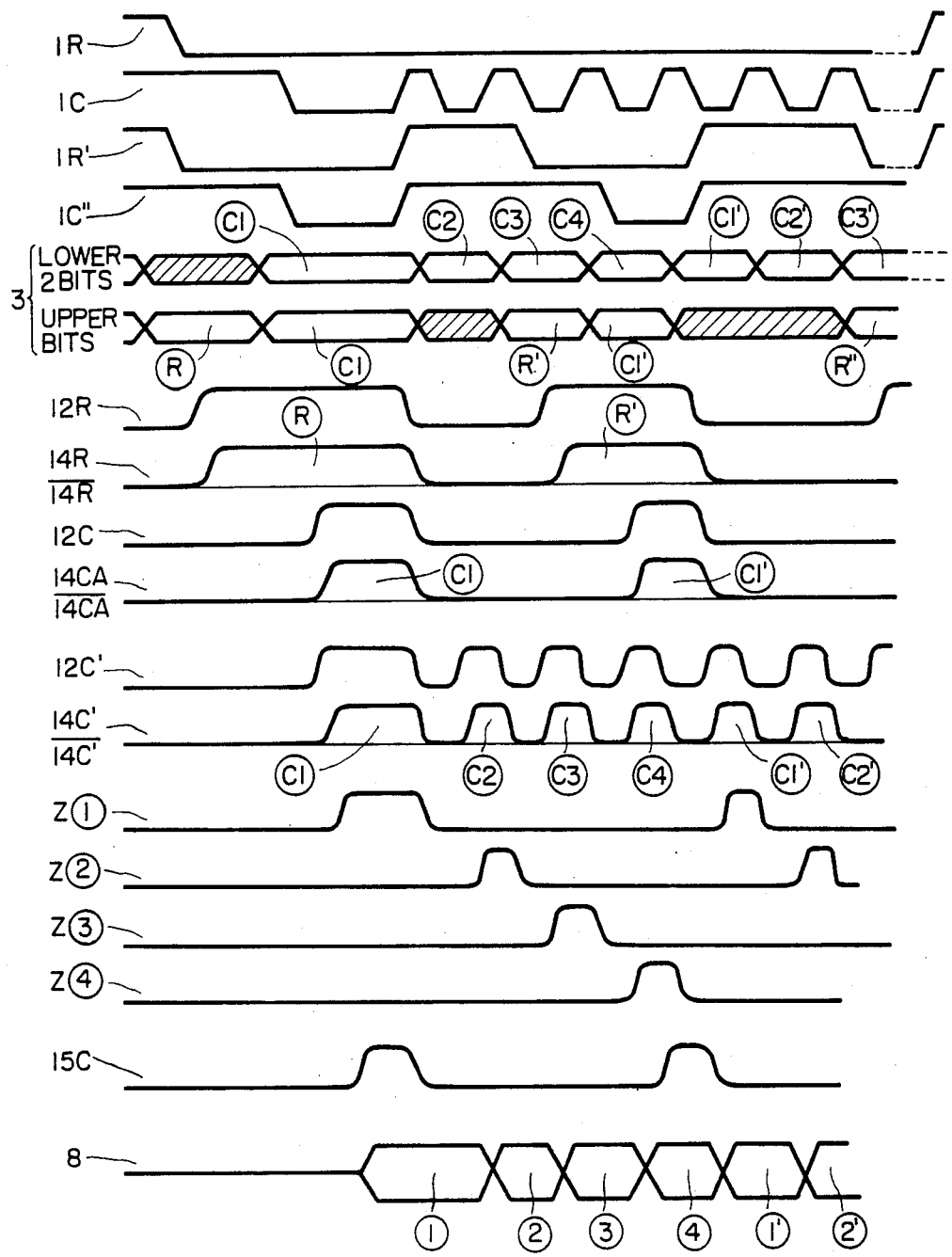
FIG. 18 is a time chart of the operation of the operation of the memory in FIG. 15.

FIG. 18 shows the detailed operating waveforms of the present memory. The present memory differs from the memory of FIG. 10 in that the continuous mode and the page mode are conducted in parallel in the latter, whereas the continuous mode and the ordinary row and column selecting operations are continuously conducted in parallel in the latter. The row and column selecting memory operations up to the circuit of the transistors $Q_{27}$–$Q_{34}$, and the continuous mode in the succeeding part are carried out in parallel and continuously.

When the signal 1R becomes the low level, the signal 1R' becomes the low level. In response to this low level, the row selecting operation based on the address input R is executed in the same manner as in FIG. 10. Subsequently, when the signal 1C beomes the low level, the signal 1C'' beomes the low level. Then, the column selecting operation based on the upper bits of the address C1 is executed as in FIG. 10, and detected data are set in the latch circuits 6C 1 ''–6C 4 ''. Thereafter, at the time when the signal 1C rises for the first time, the signals 1R' and 1C'' rise. In order to make ready for the next row and column selecting operations, the circuits 2R and 2CA respond to the rise to reset the circuits relevant to these operations into the stand-by states in the same way as in FIG. 10. Meanwhile, in response to the signal 1C, the continuous mode operation based on the lower 2 bits of the addresses C1 - C4 is performed as in FIG. 10, so that the data 1 - 4 are continuously read out from the terminal 8.

It is now supposed that, as in the case of FIG. 10, the above operation of resetting the circuits relevant to the row and column selecting operations has been finished before the continuous mode operation based on the address C3 is started. When the address C3 is applied, the signal 1R' falls in response to the signal 1C, and the row selecting operation is started on the basis of the row selection address R ' of the next set of four addresses as is applied through the lines 3 simultaneously with the address C3 . At this time, the continuous mode operation based on the address C3 is performed in parallel. Subsequently, when the address C4 is applied, the signal 1C'' falls in response to the signal 1C, and the column selecting operation based on the column selection address C ' is started similarly to the above. At this time, the continuous mode operation based on the address C4 is performed in parallel. When the row and column selecting operations based on the addresses R ' and C ' have ended in this manner, the detected data are set in the latch circuits 6C 1 ''-6C 4 '' as in the foregoing.

Thenceforth, the row and column selecting operations and the continuous mode operation are similarly performed in parallel.

In this embodiment, when the row address is applied in the phase of C3 or the like, the application of an address necessary for the continuous operation as is to be applied in C3 becomes impossible. Regarding this, no problem is involved when the memory is so constructed that the number of row addresses is smaller than the number of column addresses. In case both the numbers needs to be made equal, the necessary component of C3 may be applied at once with the upper bits of the input lines 3 when C2 is applied. That is, the addresses of the continuous operation are successively applied in the embodiment thus far described, but they may be collectively applied at once.

Further, regarding the method of addressing data, the method in which the data to be continuously fetched are common in the row addresses and different only in the column addresses has been chiefly explained in the foregoing embodiments. Needless to say, however, this method is not essential to the present invention, but it can be altered in any of the embodiments into, for example, a method in which only the row addresses are different with the column addresses being common, so the addresses of C1 - C4 are applied as the row addresses, and a method in which the addresses of rows and columns coexist.

According to the embodiment stated here, the continuous operation is permitted without any limit to the number of data (within the range of the whole capacity of the memory). Thus, it is also permitted to use the memory as if it were a shift register of high speed. Although the method of the dynamic type has been stated here, it is needless to say that not only the page mode, but also the very ordinary memory operation can be combined with the continuous operation in the static type as explained with reference to FIG. 6, on the basis of the same idea.

(4) Modified Embodiments

In the continuous mode in the foregoing embodiments, the sequence in which the four data are read out can be appointed at random by the lower 2 bits of the addresses C1 - C4 . However, a construction in which the sequence is fixed in advance is also possible.

To this end, by way of example, the selector 5Z in FIG. 8 may be replaced with a decoder 5ZA which is so constructed as to select the output lines Z 1 to 4 in the mentioned sequence each time the input signal 12C' becomes the high level. As such circuit 5ZA, there are a shift register of 4 stages which successively shifts pulses directive of the selection each time the signal 12C' is applied and the respective stages of which are directly connected to the lines Z 1 - 4  a flip-flop circuit which divides the frequency of the signal 12C' and which delivers signals for successively selecting the lines Z 1 -Z 4 , and so forth.

Figure 19:
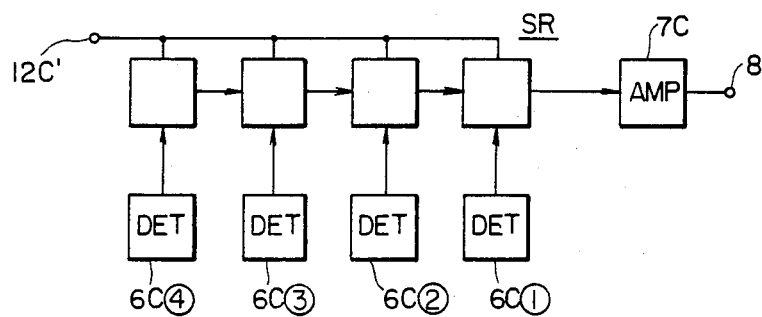
FIG. 19 shows a modified embodiment of a selector for the continuous mode operation.

Another example for reading out the four data in the fixed sequence in the continuous mode is shown in FIG. 19. The decoder 5Z and the selector 201 are replaced with a 4-stage shift register SR in which the outputs of the detectors 6C 1 -6C 4 are set in parallel and which performs the shift operation by the use of the signal 12C'. The output of the shift register SR is connected to the output amplifier 7C. Also with this measure, each time the signal 12C' is generated, data are transmitted to the output amplifier 7C in the predetermined sequence, and they can be continuously derived from the output terminal 8.

In the above examples, the sequence of the four data to be handled in the continuous mode is fixed. Therefore, the lower 2 bits of the column addresses required for the appointment of the sequence in the embodiment of FIG. 8, etc. become unnecessary, and this contributes to the reduction of the input/output terminals of the memory (the number of pins of a package). The decoder 5Z and the selector 201 can also be so constructed that, for the purpose of appointing the first data of the four data to be read out in the continuous mode, only the lower 2 bits of the column address of the first data are applied, whereupon the three data following the first data are read out in a fixed sequence. By way of example, the shift register SR in FIG. 19 may be so constructed as to cyclically circulate its contents and to provide an output from a portion appointing the head data.

In these modifications, the sequence of data to be delivered is fixed in advance. Therefore, an operation of still higher speed than in the foregoing embodiment of FIG. 8 is permitted.

While the operations of reading and writing have been individually performed in the various embodiments described above, operations in various combinations of reading and writing are permitted by simple improvements. For example, it becomes possible to perform both the operations at the same time or to write data into only some addresses in the course of the continuous operation. Hereunder, such will be explained in conjunction with embodiments.

Figure 20:
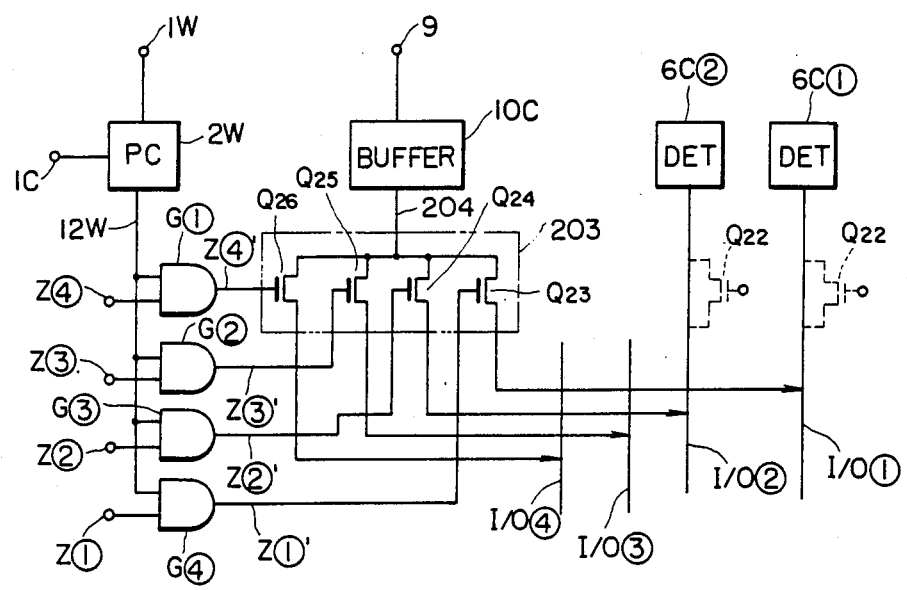
FIG. 20 shows a modified embodiment of a data write circuit.

Referring to FIG. 20, a signal 1W is an external control clock which controls read/write. Here, the high potential state of the control clock corresponds to reading, and the low potential state thereof to writing. Symbol 2W indicates a circuit which generates a plurality of timing pulses necessary for operations inside the memory, likewise to the pulse generators 2R and 2C (refer to, e.g., FIG. 1). The generated pulses are chiefly supplied to portions necessary for the read/write operation controls. Here, a signal 12W which is supplied to buffers G 1 -G 4 stated below is indicated as a typical example. The buffers G 1 -G 4 are AND circuits which take the logical products between the signal 12W and the corresponding outputs Z 1 -Z 4 of the foregoing decoder 5Z (FIG. 8) so as to control corresponding MOS transistors for selection $Q_{23}$-$Q_{26}$ in a selector 203. Under the control of the buffers, an input data arriving via a buffer 10C from an input terminal 9 is supplied to one of common input/output data line pairs I/O 1 - 4. In the figure, for the sake of brevity, the signal of each of the common input/output data line pairs I/O 1 - 4, write data lines 204, etc. is depicted as a single line. Accordingly, only one selecting MOS transistor is depicted for each of the data line pairs I/O 1 - 4 as shown by $Q_{23}$-$Q_{26}$.

Figure 21:
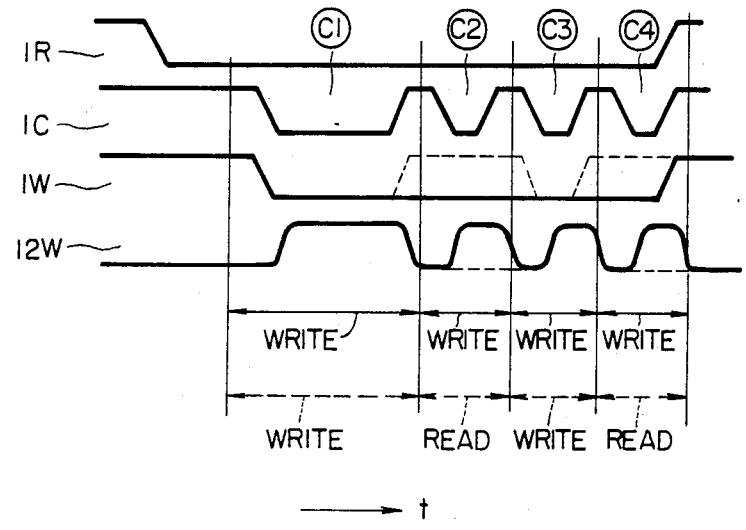
FIG. 21 is a time chart of the circuit in FIG. 20.

Referring to operating waveforms in FIG. 21, column addresses C1 - C4 are respectively applied as in FIG. 8 in the intervals of the low level of the signal 1C indicated by C1 - C4 in FIG. 21. When the signal 1W is at the low potential, the circuit 2W generates the inverted signal 12W of the signal 1C in synchronism with the fall of the signal 1C. The signal 12W and the signals Z 1 -Z 4 have their logical products taken by the AND circuits G 1 - G 4. Therefore, when the signal 12W is generated, one of lines Z 1 '-Z 4 ' is selected in correspondence with the lower 2 bits of the column address applied to the buffer 4C (FIG. 8) at that time, and the content of the buffer 10C is transmitted to one of the common input/output data line pairs I/O- 1 - 4 through the selector 203. Thus, the voltage of the data line pair is changed depending upon the write data. Thereafter, on the basis of the voltage of the line pair, the data is written into a memory cell as in the prior art.

When the signal 1W is at the high level, the signal 12W becomes the low level, and no writing is performed. Merely by changing the level of the signal 1W, accordingly, either writing or reading can be executed in the continuous mode.

For example, when the signal 1W is held at the low level during the application of the column addresses C1 - C4 as indicated by a solid line in FIG. 21, writing is performed on the basis of the addresses C1 - C4. On the other hand, when the signal 1W is made the low level during the application of only the addresses C1 and C3 as indicated by chain lines in FIG. 21, the writing operations based on the addresses C1 and C3 and the reading operations based on the addresses C2 and C4 are mixedly performed in the continuous mode. Further, in case the signal 1W is applied with a fixed time delay relative to the signal 1C, the so-called "read modify write" operation is permitted in which after the data of a certain memory cell is read out, the same memory cell is subjected to the writing operation. It is readily understood that when the "read modify write" operation is possible, read/write operations for respective memory cells can be executed at the same time.

It is sometimes necessary, depending upon the circuit arrangement of a memory, to electrically cut off the data line pairs I/O 1 - 4 and the detectors 6C when the writing operation is performed in FIG. 20. In this case, the circuits 6C may be endowed with the function of the cut-off, or switching MOSTs $Q_{22}$ as indicated by broken lines in FIG. 20 may well be disposed.

Figure 22:
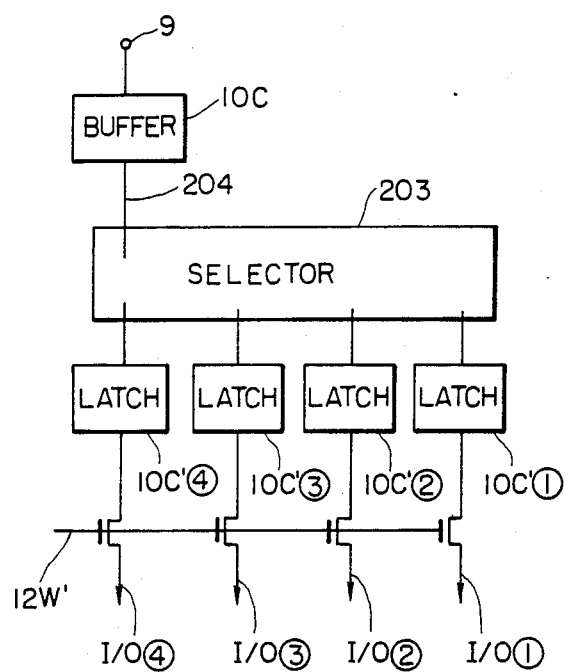
FIG. 22 shows another modification of the data write circuit.

Further, with the "read modify write" operation, there is a method in which data are simultaneously and collectively written into four memory cells. FIG. 22 shows such an embodiment. The write data are successively written by the selector 203 into latch circuits (or flip-flops) 10C' 1 -10C' 4 which are disposed in correspondence with the respective data line pairs I/O- 1 - 4. After the end of the writing into the latch circuits 10C' 1 -10C' 4, the write data are transmitted to the common input/output data lines I/O 1 - 4 in parallel under the control of the signal 12W', whereupon they are written. Here, the signal 12W' is generated by the circuit 2W.

In FIG. 20, in case of performing the reading and writing of the address C1, the writing operation needs to be executed after the reading operation of the common input/output data line pairs I/O 1 - 4 has been carried out. It is therefore feared that the speed will somewhat lower in some memory designs. In contrast, the present embodiment involves no problem because the writing is performed for the common input/output date lines which have already been read out.

Further, while the foregoing embodiments have referred to the so-called folded bit line format in which bit lines are folded on each other, the present invention is also applicable to memories of the so-called open bit format in which bit lines are arranged open on both the sides of the sense amplifier 6R. In addition, while the data to be handled by the continuous operation have been explained here as being fixed in the row addresses and being different only in the column addresses, the invention is also applicable to data whose column addresses are fixed and whose row addresses are different, data whose addresses have both the aspects combined, etc. In addition, while the memory which executes the continuous mode and the page mode by the use of the signals 1C and 1R has been disclosed in FIG. 17, the signal 1R can be dispensed with by establishing predetermined rules for the method of supplying the signal 1C. The rules are, for example, that when the signal 1C has been applied only once, only the operations concerning the selection of a row address are performed, whereupon a refresh operation peculiar to the dynamic memory is executed, and that when the signal 1C has been applied continuously twice, the ordinary read/write operations are executed. Thus, the signal 1R becomes unnecessary, which is effective for reducing the number of pins of a package for encasing the chip of the memory.

While the case of separately disposing the input and output terminals 8 and 9 has been stated here, it is needless to say that the present invention is applicable to a memory in which a single terminal is used for input and output operations in common and that it is similarly applicable to a memory in which a plurality of terminals 8 and terminals 9 are respectively prepared contrariwise to the above.

(5) Cell Array Layout

In the embodiments thus far described, one memory cell array is concentratively disposed. In a practicable memory, however, it is sometimes necessary to divide word lines into several groups to the end of shortening the delay time of the word lines to the utmost, or to divide bit lines to the end of reducing the parasitic capacitances of the bit lines and making read-out signals from memory cells great. Accordingly, there will now be described embodiments of memories in which the memory cell array is divided into several arrays. The following embodiments are applicable to all the embodiments described with reference to FIGS. 3, 6, 8, 10 and 13. Accordingly, only parts concerning the array layout will be explained below. In the ensuing description, reference symbols with suffixes L, R etc. denote the same parts in the foregoing embodiments as expressed by the reference symbols without the suffixes.

Figure 23:
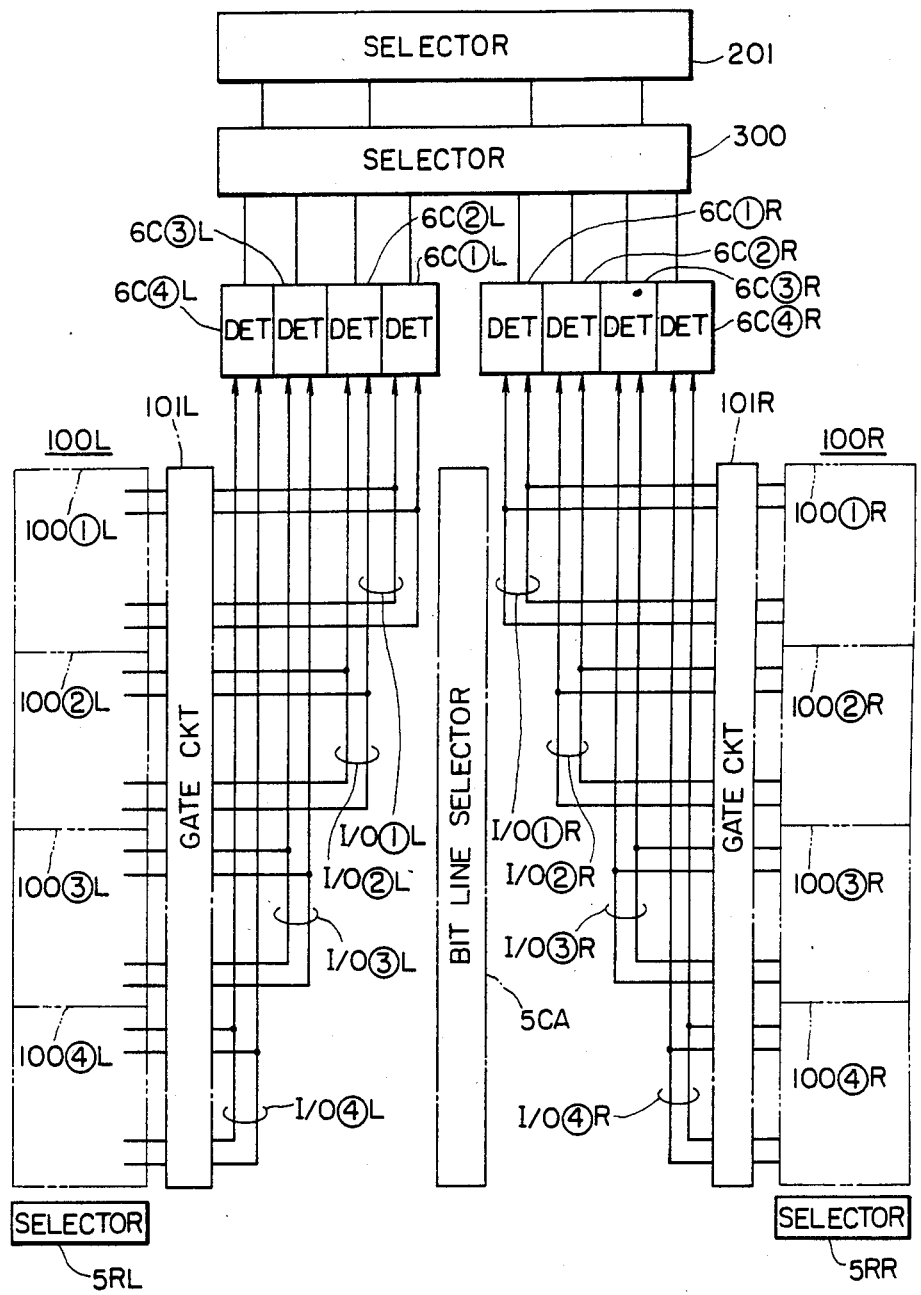
FIG. 23 shows the layout of the memory according to the present invention.

In the embodiment of FIG. 23, two arrays 100L and 100R with only bit lines divided by two are comprised. Each of the arrays 100L and 100R is subdivided into 4 blocks 100 1 L–100 4 L or 100 1 R–100 4 R.

Eight input/output data line pairs I/O 1 L–I/O 4 L and I/O 1 R–I/O 4 R are disposed in correspondence with the respective blocks. The corresponding one of detectors 6C 1 L–6C 4 L and 6C 1 R–6C 4 R is connected to each of the input/output data line pairs.

Word line selectors 5RL and 5RR are disposed in correspondence with the respective arrays, and each selects one word line of the corresponding array in response to a row address. Thus, one word line is selected for each of the left and right arrays 100L and 100R. A bit line pair selector 5CA is disposed between the two arrays. In response to the upper bits of a column address other than the lower 2 bits thereof, the selector 5CA controls a gate circuit 101L so as to select one bit line pair from each block of the array 100L and it similarly selects from each block of the array 100R one of four bit line pairs respectively corresponding to the four selected bit line pairs in the array 100L. The eight outputs which include the four outputs from the array having the selected word line are amplified by the detectors 6C 1 R–6C 4 R and 6C 1 L–6C 4 L. A selector 300 selects on the basis of the lowermost bit of the row address those four outputs among the eight outputs of the detectors 6C 1 L etc. which correspond to either the array 100L or 100R, and it applies them to a selector 201 for the continuous mode. In order to realize the operation of both the page mode and the continuous mode as in FIG. 6, the latches 6C 1 ″–6C 4 ″ and the MOS transistors Q$_{27}$–Q$_{34}$ may be interposed between the two selectors 300 and 201.

This embodiment permits the continuous mode operation in the case where the data lines are divided into two.

Figure 24:
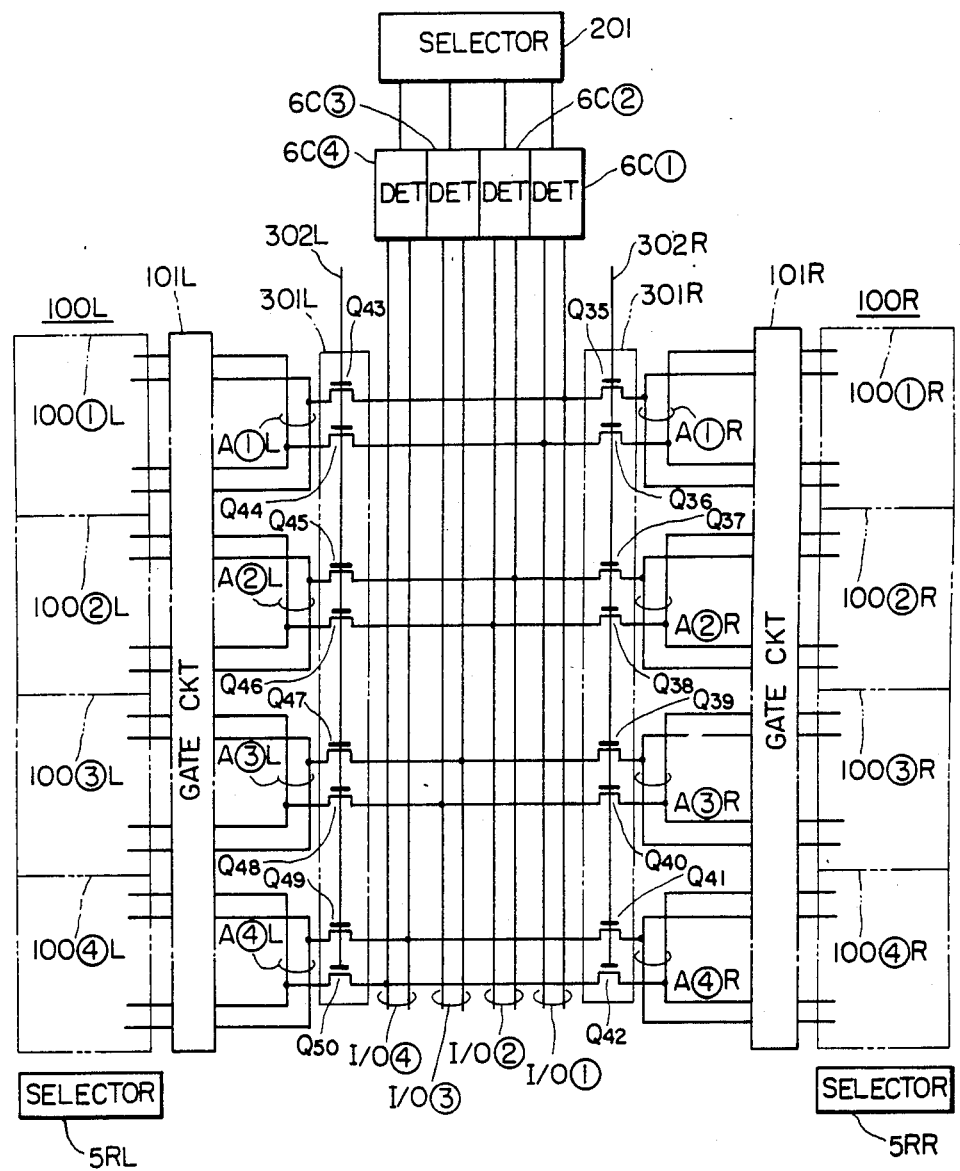
FIG. 24 shows another layout of the memory according to the present invention.

In the embodiment of FIG. 24, four input/output data line pairs I/O 1 – 4 and detectors 6C 1 –6C 4 are disposed for the same two arrays as in FIG. 23.

Each block is provided with an intermediate data line pair A 1 L (R)–A 4 L (R) which is common to all bit line pairs within the particular block. In order to connect the respective intermediate data line pairs to the corresponding data line pairs I/O 1 – 4, there are disposed a switching circuit 301R composed of MOS transistors Q$_{35}$–Q$_{42}$ and a switching circuit 301L composed of MOS transistors Q$_{43}$–Q$_{50}$.

Four data are read out from the left array 100L or right array 100R to the respective intermediate data line pairs A 1 L–A 4 L or A 1 R–A 4 R by means of a bit line selector 5CA (not shown) disposed between the arrays 100L and 100R as in FIG. 23. Supposing that the row addresses of the word lines of the arrays 100L and 100R are even and odd, respectively, the lowermost bit of a row address and the inverted bit thereof are applied to lines 302R and 302L, and either the selector 301L or 301R is turned "on". Thus, the four outputs from either of the two arrays are applied to the four data line pairs I/O 1 – 4 and are detected by the four detectors 6C 1 – 4.

According to this embodiment, the number of the input/output data line pairs or the detectors may be k necessary for the continuous mode operation, namely, four in this case, and an increase in the chip area is not incurred. In addition, the connections between the bit line pairs and the intermediate data line pairs A 1 L (R)–A 4 L (R) fall into the same simple relationship as in the prior art, and the pattern design is facilitated.

Figure 25:
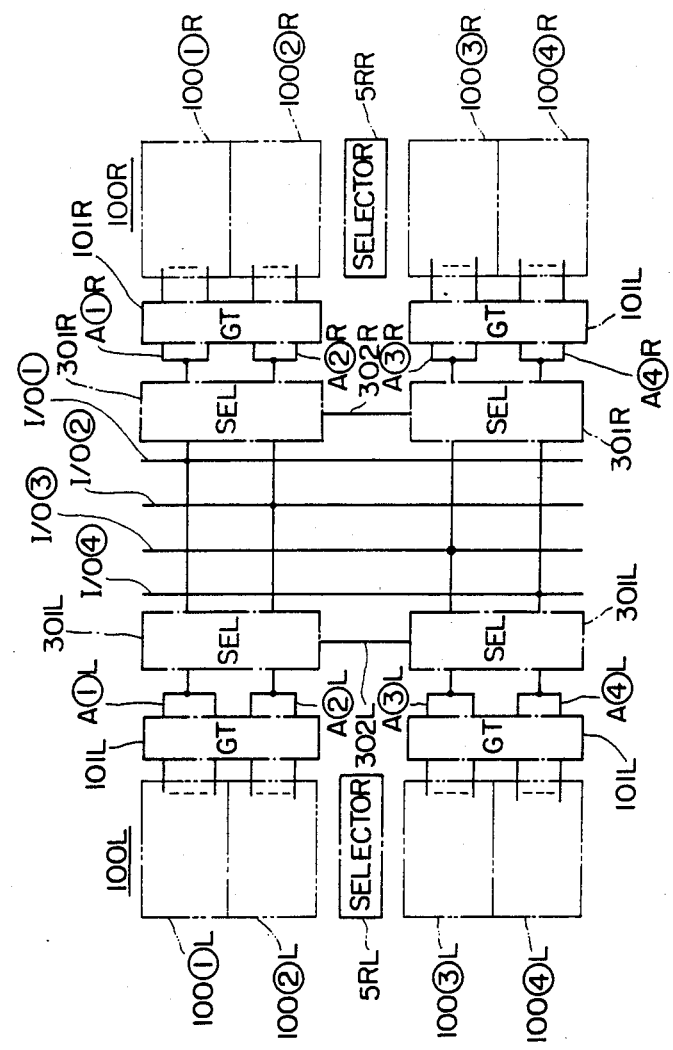
FIG. 25 shows still another layout of the memory according to the present invention.

FIG. 25 shows a memory in which both word lines and data lines are divided into two, that is, an array is divided into four. It corresponds to a case where the word lines of the arrays 100L and 100R in FIG. 24 are respectively divided between the blocks 100 2 L and 100 3 L and between the blocks 100 2 R and 100 3 R. Word line selectors 5RL and 5RR are disposed between the divided word lines. With the division of the word lines, each of the gate circuits 101L and 101R or the switching circuits 301L and 301R is vertically divided into two. The same applies to the bit line selector not shown here.

Here, for the brevity of the drawing, the intermediate data line pair A 1 L (R)–A 4 L (R), the input/output data line pair I/O 1 – 4, and respective two signals forming one set are typically indicated by a single line.

Figure 26:
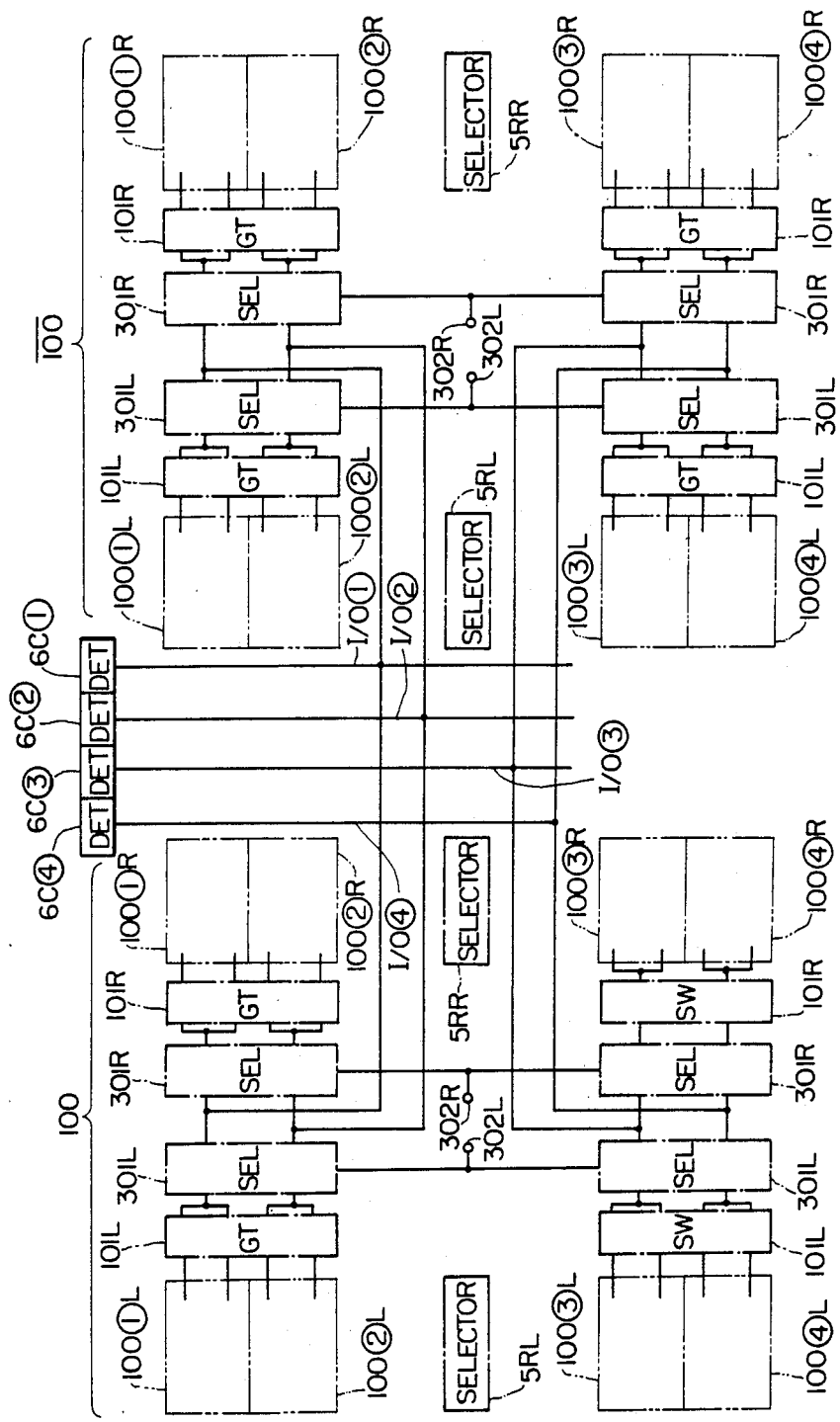
FIG. 26 shows a further layout of the memory according to the present invention.

FIG. 26 shows an embodiment in which word lines are divided into two and data lines are divided into four, that is, the whole memory is divided into eight.

The embodiment of FIG. 26 is provided with a cell array 100 at the time when both the word lines and data lines are divided into two as illustrated in FIG. 25, and a cell array $\overline{100}$ which has the same arrangement as that of the first-mentioned cell array. Input/output data line pairs I/O 1 – 4 common to the cell arrays 100 and $\overline{100}$ consist of first parts which are disposed in parallel with word lines between both the cell arrays, second parts which are disposed in parallel with data lines between blocks 100 2 R and 100 3 R within the cell array 100 and between blocks 100 2 L and 100 3 L within the cell array $\overline{100}$, and third parts for connecting the second parts and a selector 301L or 301R.

The selectors 301L and 301R included within each of the cell arrays 100 and $\overline{100}$ are respectively supplied with 2 bits in a row address from lines 302L and 302R. It is assumed by way of example that the lower 2 bits of the row addresses of the lefthand word line group and righthand word line group of the cell array 100 and the lefthand word line group and righthand word line group of the cell array $\overline{100}$ are "00", "10", "01" and "11", respectively. Then, the lines 302L and 302R within the cell array 100 and the lines 302L and 302R within the cell array $\overline{100}$ are supplied with signals of the high level when addresses externally applied are "00", "10", "01" and "11", respectively.

The above embodiment can be so modified that the second parts of the input/output data line pairs I/O-1 – 4 are further extended rightwards and that the detectors 6C 1 – 4 are disposed in the extended areas. In this case, the first parts of the input/output data line pairs I/O 1 – 4 are unnecessary. In addition, the input/output data line pairs I/O 1 – 4 can be constructed of parts extending in parallel with the word lines as in FIG. 25 and parts extending in parallel with the data lines over the cell arrays 100 and $\overline{100}$. In this case, the aforementioned first and second parts are, of course, dispensed with.

Figure 27:
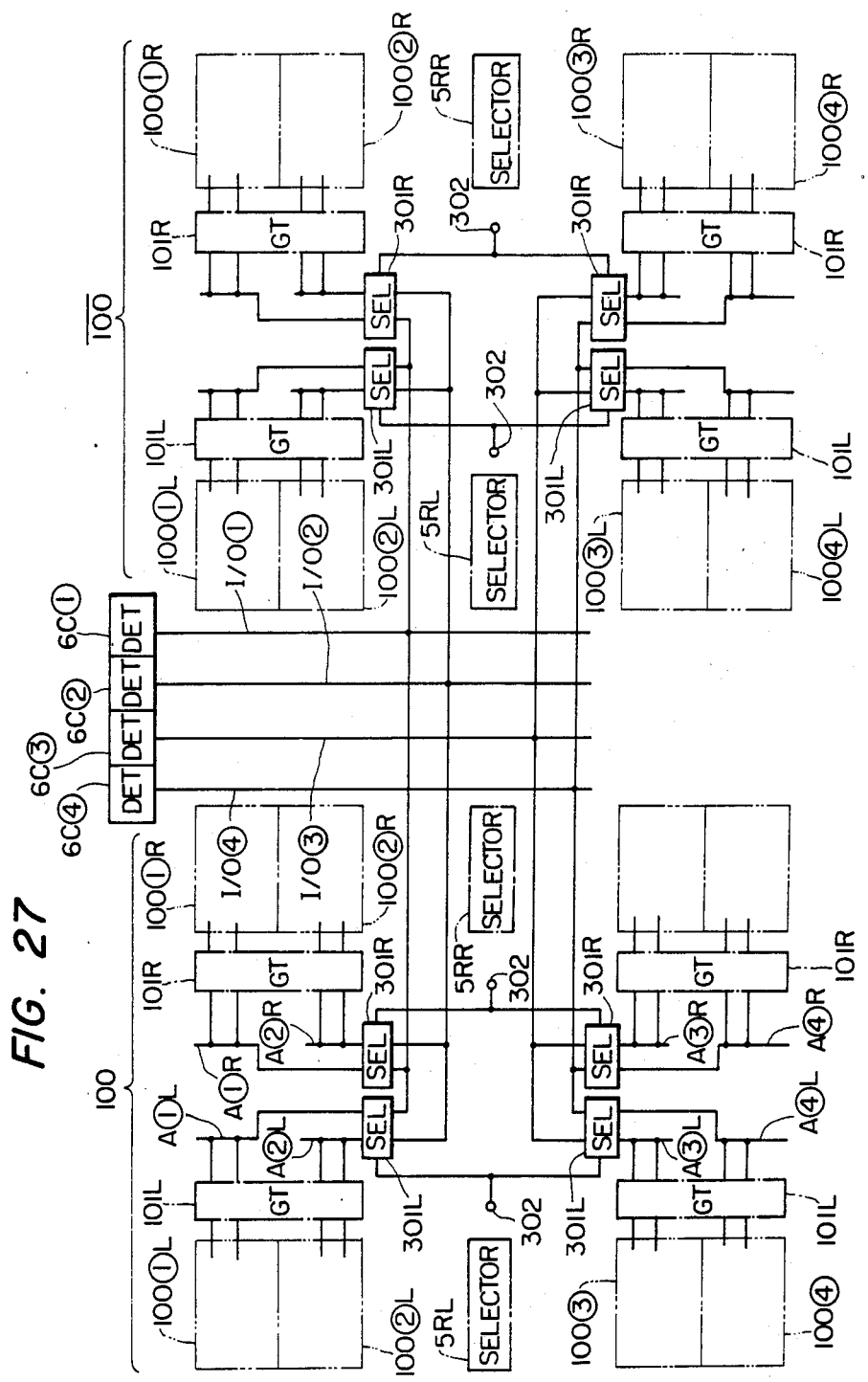
FIG. 27 shows a still further layout of the memory according to the present invention.

FIG. 27 shows an embodiment which differs from the embodiment of FIG. 26 in that the positions in the word line direction, of the selectors 301L and 301R within each of the cell arrays 100 and $\overline{100}$ are set between the blocks 100 2 L and 100 3 L, while the positions thereof in the word line direction are set between the selectors 5RL and 5RR. The positions correspond to places where a margin is comparatively left as to area in the layout design, so that the layout design of the selectors 301L and 301R is facilitated.

In the above, there have been described the examples of application of the present invention to the various memory cell arrangements. The system herein introduced in which the input/output data line pairs are disposed between the bit line pairs and the common input/output date line pairs and are selected by the switches, contributes to the reduction of the parasitic capacitances of the input/output data line pairs. It is applicable, not only to the memory effecting the continuous mode operation, but also to the prior-art memory.

Figure 28:
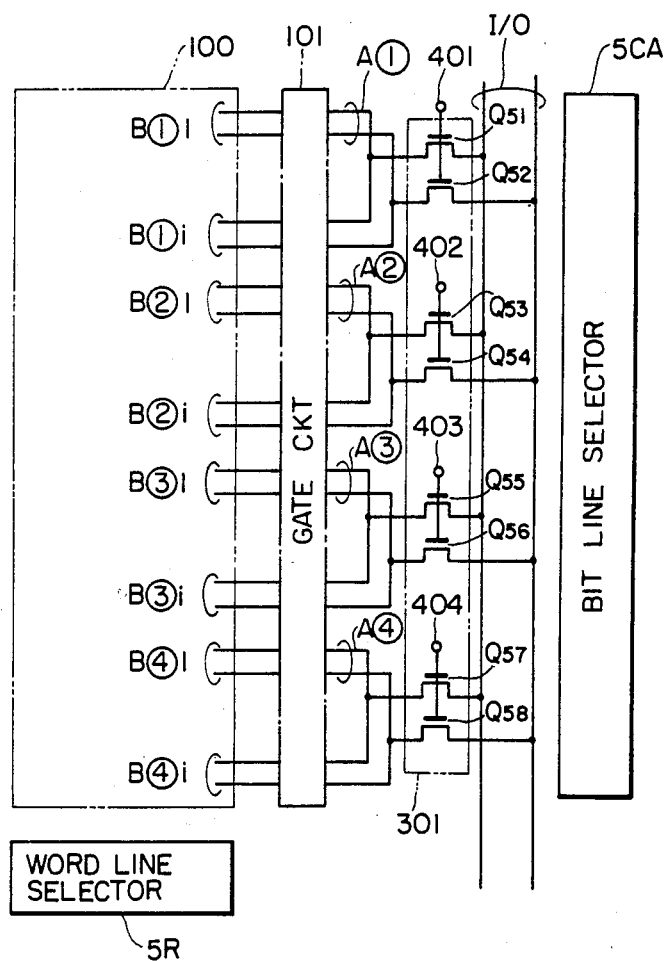
FIG. 28 shows a yet further layout of the memory according to the present invention.

FIG. 28 shows such an embodiment. It is chiefly different from the memory of FIG. 1 in that all the bit line pairs are divided into four blocks which are respectively composed of the bit line pairs B 1 1-B 1 i, B 2 1-B 2 i, B 3 1-B 3 i and B 4 1-B 4 i, that intermediate input/output data line pairs A 1 -A 4 are disposed in correspondence with the respective blocks, that a selector 301 composed of transistors $Q_{51}$-$Q_{58}$ is disposed for connecting the intermediate input/output data line pairs A 1 -A 4 to a common input/output data line pair I/O, and that a bit line selector 5CA which responds to the upper bits of a column address other than the lower 2 bits thereof is disposed as in FIG. 3. The bit line selector 5CA controls the gate circuit 101 so as to select one bit line pair from each block and to connect the selected bit line pairs to the corresponding intermediate input/output data line pair. Among the four pairs of transistors in the selector 301, only one pair is turned "on" by a circuit (not shown) which responds to the lower 2 bits of the column address. Thus, only one desired bit line pair is connected to the common data line pair I/O.

The most predominant one of the parasitic capacitances of the common input/output data line pair I/O is a depletion layer capacitance which develops between the diffusion layer of the source or drain of the MOS transistor being a constituent of the gate circuit 101 (refer to FIG. 1) and the silicon substrate of the MOS transistor. In the present embodiment, only the MOS transistors of ¼ of the total number of the MOS transistors in the gate circuit 101 are simultaneously connected to the data line pair 301. With the embodiment, accordingly, the parasitic capacitance attirbuted to the MOS transistors in the gate circuit 101 becomes ¼ of that in the prior art. Therefore, the parasitic capacitance is sharply reduced, and operations concerning the input/output data line pair I/O can be made fast.

As apparent from the above description, the layouts of FIGS. 24 to 27 are also applicable to a memory having a pair of common input/output data lines as in FIG. 28. In the embodiment of FIG. 28, three bit line pairs besides the bit line pair to be selected are selected and are connected to the corresponding three intermediate data line pairs. Since the three intermediate data line pairs are driven by only detectors (not shown) disposed for the respective bit line pairs, the operations of these detectors are feared to become slow. In order to avoid this drawback, the bit line pair selector 5CA may be formed into a circuit which controls the gate circuit so as to select only one of the bit line pairs B 1 -B 4 i in response to all the bits of the column address (that is, the same circuit as the circuit 5C in FIG. 1).

What is claimed is:

1. A memory, comprising:

a memory matrix comprised of a plurality of groups of memory cells, each group further comprising plural subgroups;

a plurality of common data lines, each corresponding to one of the groups;

first address means for simultaneously addressing a plurality of said subgroups, each addressed subgroup belonging to a different one of said groups, in response to a first address signal provided by an address line, said first address means not responding to a sequence of a second address signal which follows the first address signal;

second address means for simultaneously connecting a corresponding one of memory cells of each of the subgroups addressed by said first address means to a corresponding common data line in response to each of the sequences of the second address signals, said second address means not responding to the first address signal;

a plurality of detector means for simultaneously receiving and latching read-out signals, provided on said common data lines by memory cells accessed by said first address and second address means, said detector means repeating the receiving and latching of said read-out signals in synchronism with the sequential connection by the second address means based on the sequence of the second address signals; and output means for sequentially outputting the read-out signals latched by said detector means, in synchronism with each latching operation of said detector means and selectively outputting the read-out signals latched by said detector means in response to a third address signal.

2. A memory of claim 1, wherein:

said first address means includes first means for performing the simultaneous addressing, and second means for allowing said first means to respond to the first address signal in response to a first control signal which is provided to said second means when said first address signal is provided on the address line, and said second address means includes third means for performing said simultaneous connection, and fourth means for allowing said third means to respond to each of the second address signals in response to each of a sequence of second control signals which are provided to said fourth means when said second address signals are provided on the address line.

3. A memory of claim 1, wherein:

said first means comprises a first dynamic circuit which responds to said first address signal to perform the simultaneous addressing when a precharging operation of said first dynamic circuit terminates, and said second means includes means for terminating the precharging of the first dynamic circuit in response to the first control signal.

4. A memory of claim 2, wherein:

said third means comprises a second dynamic circuit which responds to said second address signals to perform the simultaneous connection when a precharging operation of said second dynamic circuit terminates, and said fourth means includes means for terminating the precharging of the second dynamic circuit repeatedly in response to each of the second control signals.

5. A memory of claim 1, wherein:

said output means includes means for responding to each of a sequence of control signals to selectively output the read-out signals latched by said detector means; and said second address means includes means for generating duplexed control signals of the sequence of the second control signals, and means responding to each of the second address signals in response to each of the duplexed control signals for performing the simultaneous addressing.

6. A memory of claim 1, wherein:

said output means comprises means for sequentially outputting the read-out signals latched by said latch means in response to a sequence of third address signals provided to said output means, wherein each of said third address signals indicates one of the read-out signals to be selected.

7. A memory of claim 6, wherein:

said output means includes means for responding to each of the third address signals to provide the read-out signals sequentially in response to each of a sequence of control signals which are provided in synchronism with each of the third address signals; and said second address means includes means for generating duplexed control signals of the sequence of the control signals, and means responding to each of the second address signals in response to each of said duplexed control signals for performing the simultaneous connecting.

8. A memory of claim 7, wherein:

said responding means of said output means comprises a dynamic circuit for which a precharging operation terminates in response to said control signals, to respond to said third address signals; and said responding means of said second address means comprises a dynamic circuit for which a precharging operation terminates in response to each of the duplexed control signals, to respond to each of said second address signals.

9. A memory of claim 5, wherein:

said first address means includes means for generating other duplexed control signals, each of said other duplexed control signals being generated before each of the sequence of the duplexed control signals of said second address means, and means for repeatedly performing the simultaneous addressing in response to each of a sequence of the first address signals respectively when the other duplexed control signal is provided thereto, so that the simultaneous addressing is performed in response to each of the sequence of the first address signals before each of the simultaneous connections which occur due to said second address means responding to each of the second address signals.

10. A memory of claim 9, wherein:

said performing means comprises a dynamic circuit for response to each of the other duplexed control signals.

11. A memory, comprising:

a memory matrix comprised of a plurality of groups of memory cells, each group being further comprised of plural subgroups;

a plurality of I/O lines, each corresponding to one of the groups;

first address means for simultaneously addressing a plurality of said subgroups, each addressed subgroup belonging to a different one of the groups;

second address means for simultaneously connecting a corresponding one of memory cells of each of the subgroups addressed by said first address means to a corresponding I/O line, said second address means sequentially performing the simultaneous connection for a different one of memory cells of each of the subgroups addressed by said first address means; and shift register means for sequentially outputting signals provided on said I/O lines from memory cells as a result of the operation of said first and second address means, said shift register means sequentially outputting said signals in synchronism with a control signal which controls the timing of outputting said signals, wherein said shift register is independent from said first and second address means so that said shift register outputs said signals while the first and second address means are operated.

12. A memory of claim 11, wherein:

said first address means performs the simultaneous addressing in response to a first address signal; and said second address means sequentially performs the simultaneous connection in response to each of a sequence of second address signals.

13. A memory of claim 12, wherein said first and second address means are connected to an address line so that said first address signal is provided to said address line first and thereafter the sequence of the second address signals are provided to said address line.

14. A random access memory of claim 11, wherein said memory matrix is comprised of a folded bit line structure and wherein said memory cells are dynamic memory cells forming a random access memory.

15. A memory of claim 2, 3, 4, 5, 7, 8, 12 or 14, wherein said memory matrix is comprised of a folded bit line structure and wherein said memory cells are dynamic memory cells forming a random access memory.

16. A memory, comprising:

a memory matrix comprised of a plurality of groups of memory cells;

a plurality of common data lines, each corresponding to one of the groups;

first address means for simultaneously addressing a plurality of subgroups of memory cells, each subgroup belonging to a different one of the groups, in response to a first address signal;

second address means for connecting one of the memory cells of each subgroup addressed by said first address means to a corresponding common data line in response to a second address signal;

output means for sequentially outputting, in response to a first control signal, read-out signals produced simultaneously on said common data lines as a result of operations of said first and second address means;

input means for providing write signals to said common data lines in response to a second control signal so that each of said write signals is written into one of memory cells of different groups addressed by said first and second address means; and means for enabling provision of one part of the sequence of write signals to a corresponding part of the common data lines while preventing the providing of a remaining part of the write signals to remaining common data lines, so that said corresponding part of the common data lines are used for writing of the one part of the write signals, while said remaining common data lines are used for sequential outputting of the read-out signals.

17. A memory of claim 16, wherein said input means includes means for simultaneously receiving plural write signals.

18. A memory, comprising:

a memory matrix comprised of a plurality of groups of memory cells, each group being further comprised of plural subgroups;

a plurality of common data lines, each corresponding to one of the groups;

first means for simultaneously addressing a plurality of said subgroups, each addressed subgroup belonging to a different one of the groups;

second address means for simultaneously connecting a corresponding one of memory cells of each of the subgroups addressed by said first address means to a corresponding common data line, said second means sequentially performing the simultaneous connection for a different one of memory cells of each of the subgroups addressed by said first means;

a plurality of latch means for simultaneously receiving read-out signals provided on said common data lines from memory cell by said first and second means;

a plurality of switching means for cutting off between said common data lines and said latch means; and output means for sequentially outputting said read-out signals in a constant period and continuously outputting said read-out signals over a number of read-out signals provided by one operation of said first and second means.

19. A memory of claim 18, wherein:

said output means includes means for responding to one of sequences determined by control signals and selectively outputting the read-out signals.

20. A memory of claim 18, wherein:

said output means includes means for responding to one of sequences determined by control signals and outputting the read-out signals in a fixed sequence.

21. A memory of claim 18, wherein:

said output means includes means for looping the read-out signals and responding to one of sequences determined by control signals and determining a head signal of said read-out signals and outputting the read-out signals.

* * * * *